United States Patent
Kim

(10) Patent No.: US 11,256,895 B2
(45) Date of Patent: Feb. 22, 2022

(54) SENSING PANEL HAVING FINGERPRINT SENSING PIXEL AND ELECTRONIC PEN SENSING PIXEL AND DISPLAY DEVICE HAVING THE SENSING PANEL

(71) Applicant: SAMSUNG DISPLAY CO., LTD., Yongin-si (KR)

(72) Inventor: Chul Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/987,908

(22) Filed: Aug. 7, 2020

(65) Prior Publication Data

US 2021/0064841 A1 Mar. 4, 2021

(30) Foreign Application Priority Data

Aug. 27, 2019 (KR) .................. 10-2019-0104943

(51) Int. Cl.
  *G06F 3/041* (2006.01)
  *G06K 9/00* (2022.01)
  *G06F 3/046* (2006.01)
  *G06F 3/044* (2006.01)

(52) U.S. Cl.
  CPC .......... *G06K 9/0004* (2013.01); *G06F 3/046* (2013.01); *G06F 3/04166* (2019.05); *G06F 3/0446* (2019.05); *G06F 2203/04106* (2013.01)

(58) Field of Classification Search
  CPC .......... G06K 9/00006; G06K 9/00013; G06K 9/0004; G06F 3/04166; G06F 3/046; G06F 3/0446; G06F 2203/04106
  See application file for complete search history.

(56) References Cited

U.S. PATENT DOCUMENTS

| | | |
|---|---|---|
| 5,792,997 A | 8/1998 | Fukuzaki |
| 10,083,335 B2 | 9/2018 | Zhang |
| 10,360,430 B2 | 7/2019 | Zhang et al. |

(Continued)

FOREIGN PATENT DOCUMENTS

| | | |
|---|---|---|
| CN | 106873867 | 6/2017 |
| CN | 109784303 | 5/2019 |

(Continued)

OTHER PUBLICATIONS

European Search Report dated Dec. 23, 2020 in corresponding European Patent Application No. 20192945.2 (7 pages).

*Primary Examiner* — Lisa S Landis

(74) *Attorney, Agent, or Firm* — F. Chau & Associates, LLC

(57) ABSTRACT

A sensing panel includes a sensing base layer, a first group of fingerprint sensing pixels disposed on a first region of the sensing base layer and connected to a plurality of fingerprint scan lines and a plurality of first fingerprint receiving lines, and a first pen sensing pixel disposed on a second region of the sensing base layer and connected to a pen scan line, a first pen transmission line, and a first pen receiving line. The first pen sensing pixel includes a first sensing coil surrounding the first region of the sensing base layer on which the first group of fingerprint sensing pixels are disposed. A portion of the first sensing coil is adjacent to a first fingerprint sensing pixel of the first group of fingerprint sensing pixels.

27 Claims, 31 Drawing Sheets

(56) References Cited

U.S. PATENT DOCUMENTS

| | | | |
|---|---|---|---|
| 2013/0257782 A1* | 10/2013 | Nakagawa | G06F 3/0386 345/173 |
| 2015/0177884 A1* | 6/2015 | Han | G06F 3/04166 345/174 |
| 2018/0032173 A1 | 2/2018 | Kim et al. | |
| 2018/0136762 A1 | 5/2018 | Jeong et al. | |
| 2018/0196544 A1 | 7/2018 | Wang et al. | |
| 2019/0018516 A1 | 1/2019 | Kim et al. | |

FOREIGN PATENT DOCUMENTS

| | | |
|---|---|---|
| EP | 3258353 | 12/2017 |
| KR | 10-2019-0008491 | 1/2019 |

\* cited by examiner

SENSING PANEL HAVING FINGERPRINT SENSING PIXEL AND ELECTRONIC PEN SENSING PIXEL AND DISPLAY DEVICE HAVING THE SENSING PANEL

CROSS-REFERENCE TO RELATED APPLICATION

This U.S. non-provisional patent application claims priority under 35 U.S.C. § 119 to Korean Patent Application No. 10-2019-0104943, filed on Aug. 27, 2019, the contents of which are hereby incorporated by reference in its entirety.

BACKGROUND

1. Field of Disclosure

The present invention relates to a display device. More particularly, the present invention relates to a display device having a sensing panel to sense an external input.

2. Description of the Related Art

Multimedia display devices, such as televisions, mobile phones, tablet computers, navigation units, and game units, include a display device to display an image. The display device includes an input sensing panel that provides a touch-based input method allowing a user to easily and intuitively input information or commands in addition to the usual input methods, such as buttons, keyboard, mouse, etc.

In recent years, a method of using fingerprint, which is one of biometric information, is being proposed as a user authentication method for online banking, product purchase, and security, and demands for a touch display device having a fingerprint recognition function are increasing.

Meanwhile, an electronic pen is used for a user who is familiar with information input through a writing instrument or a fine touch input for a specific application program, for example, an application program for sketching or drawing.

Accordingly, the display device is desirable to detect various inputs, such as a touch input by a user's hand, a fingerprint input, and an electronic pen input.

SUMMARY

The present disclosure provides a sensing panel including a fingerprint sensing pixel and an electronic pane sensing pixel.

The present disclosure provides a display device capable of sensing a fingerprint and an input by an electronic pen on a front surface thereof.

According to an exemplary embodiment of the present invention, a sensing panel includes a sensing base layer, a first group of fingerprint sensing pixels disposed on a first region of the sensing base layer and connected to a plurality of fingerprint scan lines and a plurality of first fingerprint receiving lines, and a first pen sensing pixel disposed on a second region of the sensing base layer and connected to a pen scan line, a first pen transmission line, and a first pen receiving line. The first pen sensing pixel includes a first sensing coil surrounding the first region of the sensing base layer on which the first group of fingerprint sensing pixels are disposed. A portion of the first sensing coil is adjacent to a first fingerprint sensing pixel of the first group of fingerprint sensing pixels.

According to an exemplary embodiment of the present invention, a display device includes a display panel with an input sensor sensing an external input and a display including pixels, a sensing panel disposed on one surface of the display panel to sense a fingerprint and a pen input, and a control circuit controlling the sensing panel and receiving a plurality of fingerprint receiving signals and a plurality of pen receiving signals from the sensing panel. The sensing panel includes a sensing base layer, a first group of fingerprint sensing pixels disposed on a first region of the sensing base layer and connected to a plurality of fingerprint scan lines and a plurality of first fingerprint receiving lines, and a first pen sensing pixel disposed on a second region of the sensing base layer and connected to a pen scan line, a first pen transmission line, and a first pen receiving line. The first pen sensing pixel includes a first sensing coil surrounding the first region of the sensing base layer on which the first group of fingerprint sensing pixels are disposed. A portion of the first sensing coil is adjacent to a first fingerprint sensing pixel of the first group of fingerprint sensing pixels.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
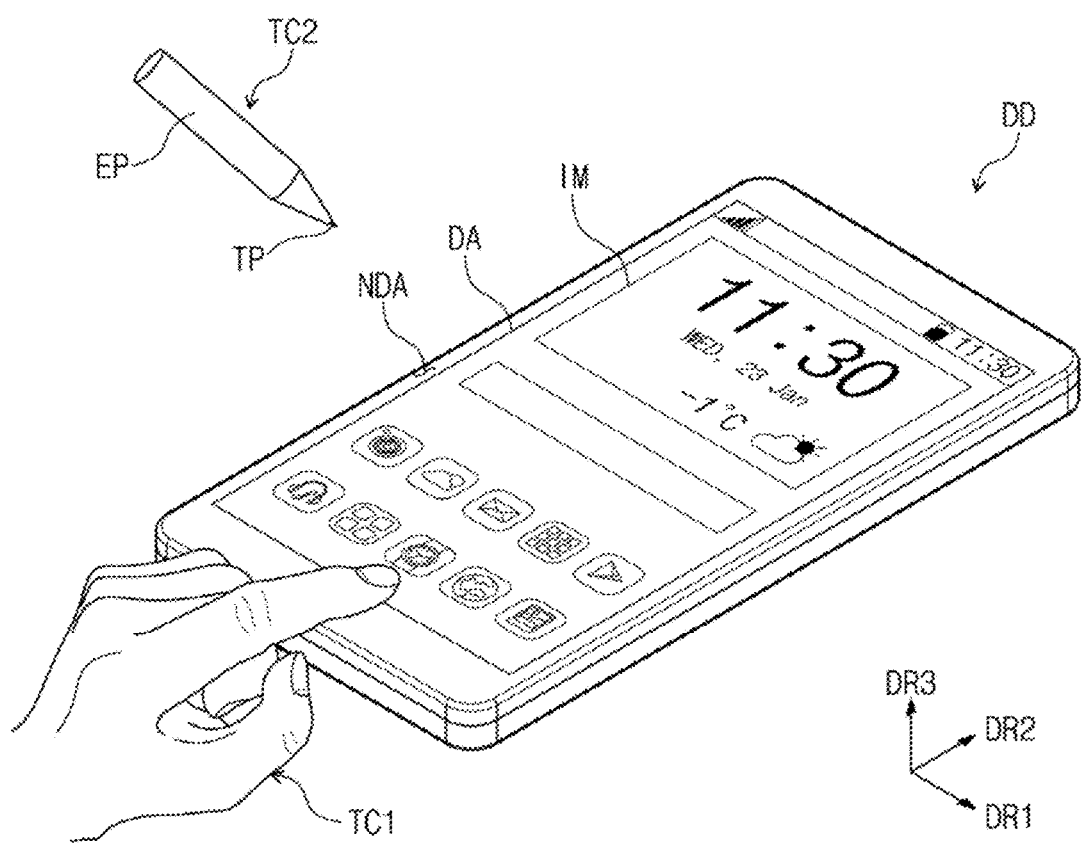
FIG. 1 is a perspective view showing a display device according to an exemplary embodiment of the present disclosure.

In the following descriptions, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

FIG. 1 is a perspective view showing a display device DD according to an exemplary embodiment of the present disclosure.

FIG. 1 shows a mobile terminal as a representative example of the display device DD according to the exemplary embodiment of the present disclosure. The mobile terminal may include a tablet PC, a smartphone, a personal digital assistants (PDA), a portable multimedia player (PMP), a game unit, a wrist-type electronic device, or the like, however, it should not be limited thereto or thereby.

The display device DD of the present disclosure may be applied to a large-sized electronic item, such as a television set or an outdoor billboard, and a small and medium-sized electronic item, such as a personal computer, a notebook computer, a car navigation unit, and a camera. These are merely exemplary, and thus, the display device DD may be applied to other electronic devices as long as they do not depart from the concept of the present disclosure.

As shown in FIG. 1, the display device DD may display an image IM through a display surface, which is substantially parallel to each of a first direction DR1 and a second direction DR2, toward a third direction DR3. The display surface, through which the image IM is displayed, may correspond to a front surface of the display device DD. The display device DD may include a plurality of areas distinguished from each other on the display surface. The display surface may include a display area DA through which the image IM is displayed and a non-display area NDA defined adjacent to the display area DA. The non-display area NDA may be called a bezel area. As an example, the display area DA may have a quadrangular shape. The non-display area NDA may surround the display area DA. However, this is merely exemplary, and the non-display area NDA may be disposed adjacent to only one side of the display area DA, or may be omitted. In addition, although not shown in the drawing, the display device DD may have a shape that is partially curved. Accordingly, a portion of the display area DA may have a curved shape. For example, a portion of the display area DA may be bent, and thus the image may be displayed not only toward the third direction DR3 but also toward the first direction DR1.

Front (or upper, or first) and rear (or lower, or second) surfaces of each member of the display device DD are defined with respect to a direction in which the image IM is displayed. However, directions indicated by the first, second, and third directions DR1, DR2, and DR3 are relative to each other, and thus, the directions indicated by the first, second, and third directions DR1, DR2, and DR3 may be changed to other directions. Hereinafter, the first, second, and third directions may refer to the same reference numerals in the directions respectively indicated by the first, second, and third directional axes DR1, DR2, and DR3.

The display device DD according to an exemplary embodiment of the present disclosure may sense a first input TC1 by a user, which is applied from the outside. The first input TC1 by the user may include various types of external inputs, such as a portion of user's body, light, heat, or pressure. In the present exemplary embodiment, it is assumed that the first input TC1 by the user is a touch input applied to the front surface by a user's hand, for example. As described above, the first input TC1 by the user may be provided in various forms. In addition, the display device DD may sense the first input TC1 by the user applied to a side surface of a rear surface of the display device DD depending on its structure, however, it should not be particularly limited.

In addition, the display device DD may sense a second input TC2 applied thereto from the outside. The second input TC2 may include inputs generated by an electronic input device, e.g., a stylus pen, a touch pen, an electronic pen, or an e-pen, rather than the input by the user's hand. In the following descriptions, it is assumed that the second input TC2 is generated by the electronic pen EP. The electronic pen EP may include a tip TP formed of a conductive material. The display device DD may sense the second input TC2 by sensing an electromagnetic resonance due to an electromagnetic induction generated between an internally-generated magnetic field and the tip TP of the electronic pen EP.

In an example embodiment, a fingerprint sensing operation with respect to the first input TC1 and a sensing operation with respect to the second input TC2 from the electronic pen EP may be performed substantially at the same time.

Figure 2:
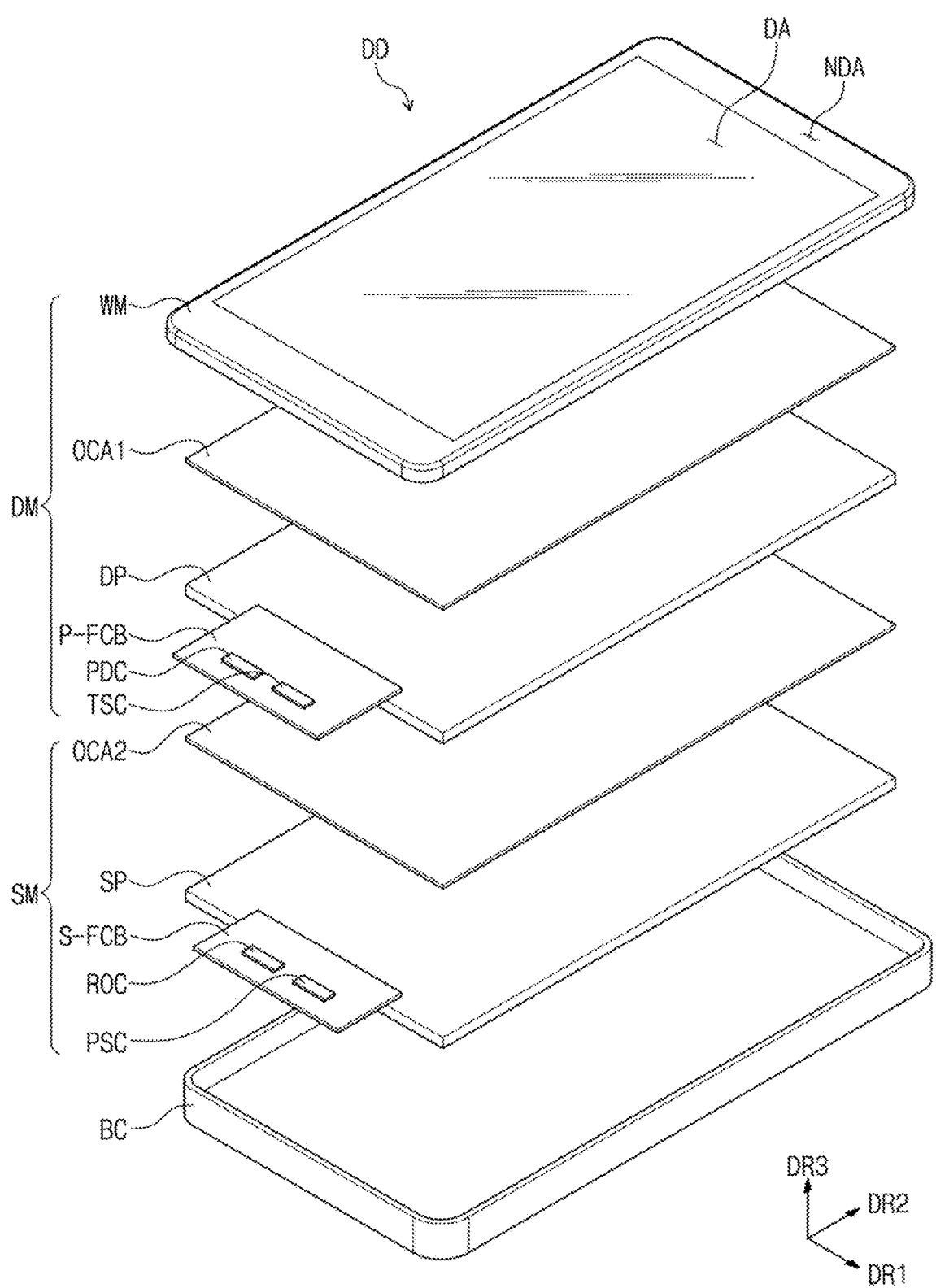
FIG. 2 is an exploded perspective view showing a display device according to an exemplary embodiment of the present disclosure.

FIG. 2 is an exploded perspective view showing the display device DD according to an exemplary embodiment of the present disclosure.

Referring to FIG. 2, the display device DD may include a display module DM and a sensing module SM. The display module DM may include a window member WM, a first adhesive member OCA1, a display panel DP, a panel circuit board P-FCB, a panel driving circuit PDC, and a touch sensing circuit TSC.

The window member WM may provide the front surface of the display device DD shown in FIG. 1. The window member WM may include a glass substrate, a sapphire substrate, or a plastic substrate. The window member WM may further include a functional coating layer, such as an anti-fingerprint layer, an anti-reflective layer, and a hard coating layer. As an example, the window member WM has a flat shape in the display area DA, however, the shape of the window member WM may be changed. Edges of the window member WM, which face each other in the first direction DR1, may have a curved surface.

The display panel DP is disposed on a rear surface of the window member WM and generates the image. The display panel DP may sense the first input TC1 (refer to FIG. 1) by the user. In the present exemplary embodiment, the display panel DP has the flat display surface as a representative example, however, the shape of the display panel DP may be changed. Edges of the display panel DP, which face each other in the first direction DR1, may be bent from their center portions to provide a curved surface.

The display panel DP may include a variety of display elements. For example, the display element may be a liquid crystal capacitor, an organic light emitting element, an electrophoretic element, or an electrowetting element. The display element according to an exemplary embodiment may include a plurality of organic light emitting diodes. For example, the display panel DP according to the present disclosure may be a flexible display panel, e.g., an organic light emitting display panel.

The first adhesive member OCA1 may be disposed between the window member WM and the display panel DP. The first adhesive member OCA1 may be a transparent adhesive member, however, it should not be limited thereto or thereby.

One end of the panel circuit board P-FCB may be bonded to pads arranged in an area of the display panel DP to be electrically connected to the display panel DP. According to an exemplary embodiment, each of the panel driving circuit PDC and the touch sensing circuit TSC may be mounted on the panel circuit board P-FCB in a chip-on-film (COF) manner after being implemented in an integrated circuit IC. Although not shown separately, a plurality of passive elements and a plurality of active elements may be further mounted on the panel circuit board P-FCB. The panel circuit board P-FCB may apply electrical signals to the display panel DP via signal lines. The panel circuit board P-FCB may be implemented in a flexible printed circuit board. In FIG. 2, the panel driving circuit PDC and the touch sensing circuit TSC are mounted on one panel circuit board P-FCB, however, they should not be limited thereto or thereby. For example, the panel driving circuit PDC and the touch sensing circuit TSC may be respectively mounted on two panel circuit boards.

The sensing module SM may be disposed on a rear surface of the display panel DP and may include a second adhesive member OCA2, a sensing panel SP, a sensing circuit board S-FCB, a fingerprint readout circuit ROC, and a pen sensing circuit PSC. The fingerprint readout circuit ROC and the pen sensing circuit PSC may control an operation of the sensing panel SP. For example, the fingerprint readout circuit ROC may receive a fingerprint receiving signal from the sensing panel SP, and the pen sensing circuit PSC may receive a pen receiving signal from the sensing panel SP. In the present exemplary embodiment, the sensing module SM is disposed on the rear surface of the display panel DP, however, the present disclosure should not be limited thereto or thereby. For example, the sensing module SM may be disposed on an upper surface of the display panel DP.

The second adhesive member OCA2 may be disposed between the display panel DP and the sensing panel SP. The second adhesive member OCA2 may be, but not limited to, an optically transparent adhesive member.

In FIG. 2, the first adhesive member OCA1 is included in the display module DM, and the second adhesive member OCA2 is included in the sensing module SM, however, the present disclosure should not be limited thereto or thereby.

The sensing panel SP may sense an amount of light, which is emitted from the display panel DP to the outside through the window member WM, and is reflected by the user's hand, to sense fingerprint information of the user.

One end of the sensing circuit board S-FCB may be bonded to pads arranged in an area of the sensing panel SP to be electrically connected to the sensing panel SP. According to an exemplary embodiment, each of the fingerprint readout circuit ROC and the pen sensing circuit PSC may be mounted on the sensing circuit board S-FCB in a chip-on-film (COF) manner after being implemented in an integrated circuit IC. Although not shown separately, a plurality of passive elements and a plurality of active elements may be further mounted on the sensing circuit board S-FCB. The sensing circuit board S-FCB may apply electrical signals to the sensing panel SP via signal lines and may receive the fingerprint sensing signal from the sensing panel SP. The sensing circuit board S-FCB may be implemented in a flexible printed circuit board.

In the present exemplary embodiment, the panel circuit board P-FCB and the sensing circuit board S-FCB respectively connected to one end of the display panel DP and one end of the sensing panel SP may be disposed to face each other, however, the present disclosure should not be limited thereto or thereby. As another exemplary embodiment, the panel circuit board P-FCB and the sensing circuit board S-FCB may be disposed to be spaced apart from each other in the second direction DR2. For example, the panel circuit board P-FCB may be connected to one side of the display panel DP, and the sensing circuit board S-FCB may be connected to a side of the sensing panel SP, which corresponds to the other side of the display panel DP.

The display device DD may further include a variety of elements in addition to the display module DM and the sensing module SM shown in FIG. 1 to control an operation of the display module DM and the sensing module SM. The circuit elements of the display device DD will be described later in detail with reference to FIG. 4.

The display device DD according to the exemplary embodiment of the present disclosure may further include a lower case BC. The window member WM and the lower case BC may be coupled to each other to accommodate the display module DM and the sensing module SM.

In an example embodiment, the sensing panel SP may perform a fingerprint sensing operation with respect to the first input TC1 of FIG. 1 and a sensing operation with respect to the second input TC2 from the electronic pen EP of FIG. 1 substantially at the same time.

Figure 3A:
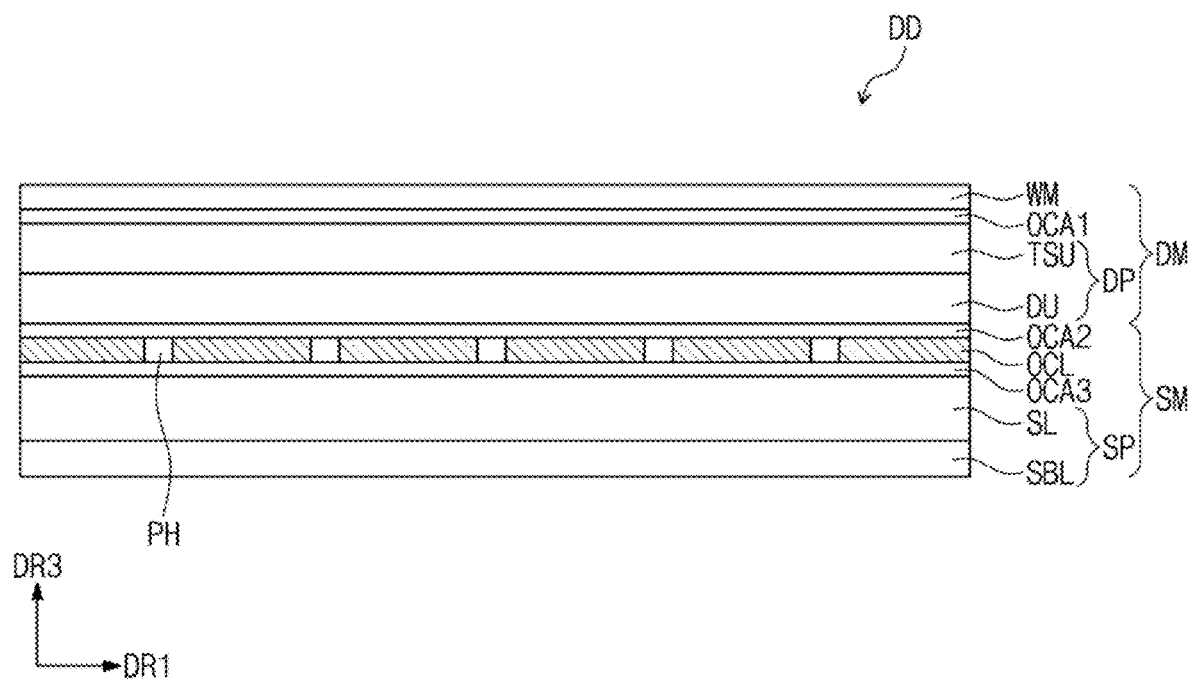
FIGS. 3A and 3B are cross-sectional views showing a display device according to an exemplary embodiment of the present disclosure.

FIG. 3A is a cross-sectional view showing the display device DD according to an exemplary embodiment of the present disclosure.

Referring to FIG. 3A, the display device DD may include the display module DM and the sensing module SM. The display module DM may include the window member WM, the first adhesive member OCA1, and the display panel DP. The display panel DP may include a touch sensing unit TSU and a display unit DU. According to another embodiment, a stacking order of the touch sensing unit TSU and the display unit DU may be changed. According to another embodiment, the window member WM may include an anti-reflective layer and a window layer.

The touch sensing unit TSU may sense the first input TC1 shown in FIG. 1. As described above, the first input TC1 may be one of various types of external inputs, such as a touch by the user's body, heat, pressure, or a combination thereof. Therefore, the touch sensing unit TSU may be called an input sensing unit (e.g., an input sensor).

The sensing module SM may include a sensing panel SP and the second adhesive member OCA2. The sensing panel SP may include a sensing base layer SBL and a sensing layer SL. The sensing module SM may further include an optical layer OCL and a third adhesive member OCA3, which are disposed on an upper surface of the sensing panel SP. The third adhesive member OCA3 combines the optical layer OCL and the sensing panel SP. The third adhesive member OCA3 may be an optically transparent adhesive member. The optical layer OCL may include a plurality of transmission pin holes PH that transmits the light reflected by the fingerprint of the first input TC1 (refer to FIG. 1). For example, the transmission pin holes PH may penetrate the optical layer OCL so that light may travel to the sensing panel SP.

Figure 3B:
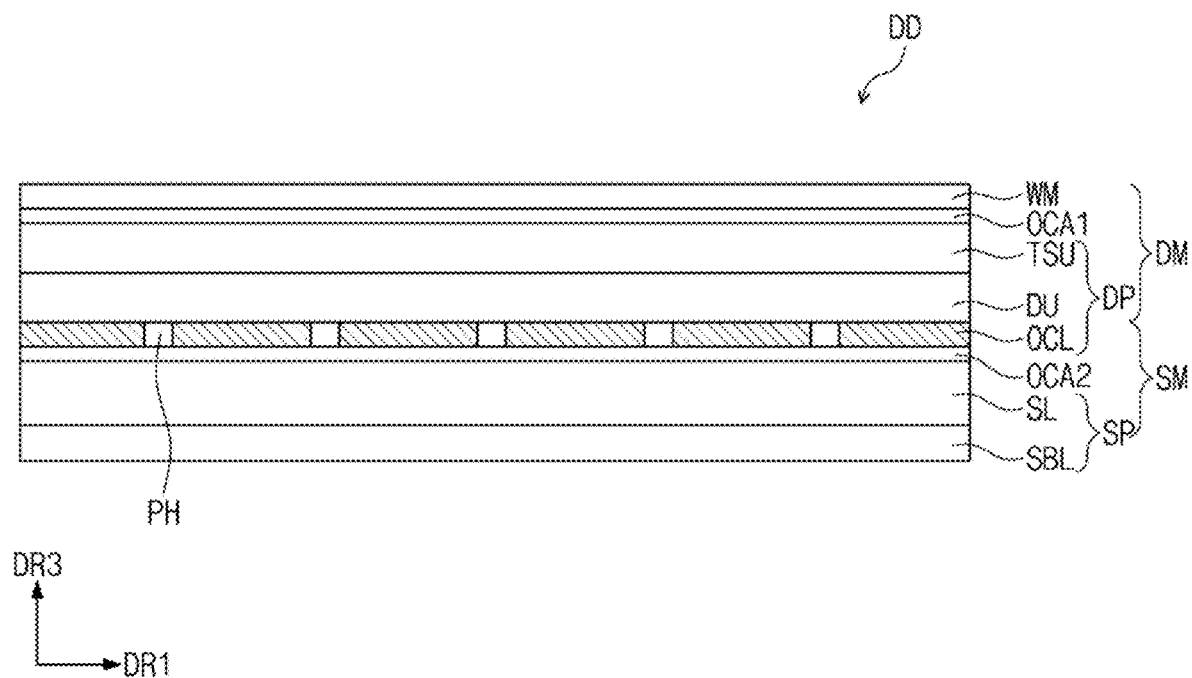

FIG. 3B is a cross-sectional view showing a display device DD according to an exemplary embodiment of the present disclosure.

Referring to FIG. 3B, the display device DD may include a display module DM and a sensing module SM. The display module DM may include the window member WM, the first adhesive member OCA1, and the display panel DP. The display panel DP may include the touch sensing unit TSU, the display unit DU, and the optical layer OCL. According to another embodiment, the window member WM may include the anti-reflective layer and the window layer.

The optical layer OCL may include a plurality of transmission pin holes PH that transmits the light reflected by the fingerprint of the first input TC1 (refer to FIG. 1). The optical layer OCL will be described in detail later. Although not shown in figures, an adhesive member that combines the display unit DU and the optical layer OCL may be disposed between the display unit DU and the optical layer OCL. For example, the transmission pin holes PH may penetrate the optical layer OCL so that light may travel to the sensing panel SP.

The touch sensing unit TSU may sense the first input TC1 shown in FIG. 1. As described above, the first input TC1 may be one of various types of external inputs, such as a touch by the user's body, heat, pressure, or a combination thereof. Accordingly, the touch sensing unit TSU may be called an input sensing unit.

The sensing module SM may include the sensing panel SP and the second adhesive member OCA2. The sensing panel SP may include the sensing base layer SBL and the sensing layer SL.

Figure 4:
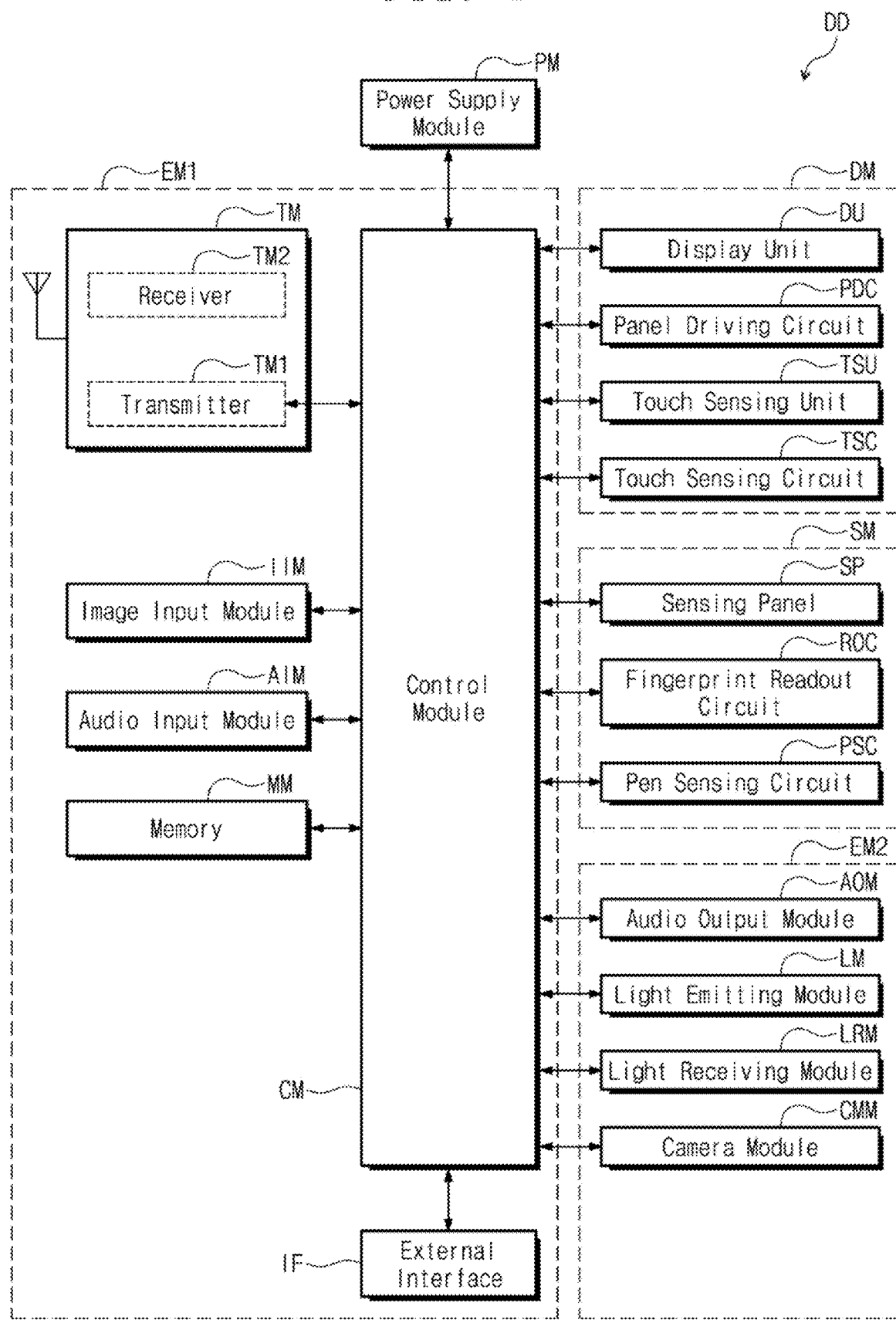
FIG. 4 is a block diagram showing the display device shown in FIG. 1.

FIG. 4 is a block diagram showing the display device DD shown in FIG. 1.

Referring to FIG. 4, the display device DD may include the display module DM, a power supply module PM, a first electronic module EM1, a second electronic module EM2, and the sensing module SM. The display module DM, the power supply module PM, the first electronic module EM1, the second electronic module EM2, and the sensing module SM may be electrically connected to each other. FIG. 4 shows that the display module DM may include the display unit DU, the panel driving circuit PDC, the touch sensing unit TSU, and the touch sensing circuit TSC.

In addition, FIG. 4 shows that the sensing module SM may include the sensing panel SP, the fingerprint readout circuit ROC, and the pen sensing circuit PSC. Configurations and functions of the sensing module SM will be described later.

The power supply module PM supplies a power source necessary for an overall operation of the display device DD. The power supply module PM may include a normal battery module.

The first electronic module EM1 and the second electronic module EM2 may include a variety of functional modules to drive the display device DD. The first electronic module EM1 may be directly mounted on a mother board electrically connected to the display module DM or may be electrically connected to the mother board via a connector (not shown) after being mounted on a separate substrate.

The first electronic module EM1 may include a control module CM, a wireless communication module TM, an image input module IIM, an audio input module AIM, a memory MM, and an external interface IF. Some modules among the modules may be electrically connected to the mother board through a flexible circuit board without being mounted on the mother board.

The control module CM may control an overall operation of the display device DD. The control module CM may be, but not limited to, a controller such as a microprocessor. For example, the control module CM may activate or deactivate the display module DM. The control module CM may control other modules, such as the image input module IIM or the audio input module AIM, based on the touch signal provided from the display module DM. The control module CM may perform a user authentication based on a fingerprint signal provided from the sensing module SM.

The wireless communication module TM may transmit/receive a wireless signal to/from other terminals using a Bluetooth or WiFi link. The wireless communication module TM may transmit/receive a voice signal to/from a repeater using a general communication line. The wireless communication module TM may include a transmitter TM1 that modulates a signal to be transmitted and transmits the modulated signal and a receiver TM2 that demodulates a signal applied thereto.

The image input module IIM may process an image signal and may convert the image signal into image data that may be displayed through the display module DM. The audio input module AIM may receive an external sound signal through a microphone in a record mode or a voice recognition mode and may convert the external sound signal to electrical voice data.

The external interface IF may serve as an interface between the control module CM and external devices, such as an external charger, a wired/wireless data port, a card socket (e.g., a memory card and a SIM/UIM card), etc.

The second electronic module EM2 may include an audio output module AOM, a light emitting module LM, a light receiving module LRM, and a camera module CMM. The modules may be directly mounted on the mother board, may be electrically connected to the display module DM through a connector (not shown) after being mounted on a separate substrate, or may be electrically connected to the first electronic module EM1.

The audio output module AOM may convert audio data provided from the wireless communication module TM or audio data stored in the memory MM and may output the converted audio data to the outside.

The light emitting module LM may generate a light and may output the light. The light emitting module LM may emit an infrared ray. The light emitting module LM may include an LED element. The light receiving module LRM may sense the infrared ray. The light receiving module LRM may be activated when the infrared ray having a predetermined level or higher is sensed. The light receiving module LRM may include a complementary metal oxide semiconductor (CMOS) sensor. The infrared ray generated by and output from the light emitting module LM may be reflected by an external object, e.g., a user's finger or face, and the reflected infrared ray may be incident into the light receiving module LRM. The camera module CMM takes an image of an external object.

Figure 5:
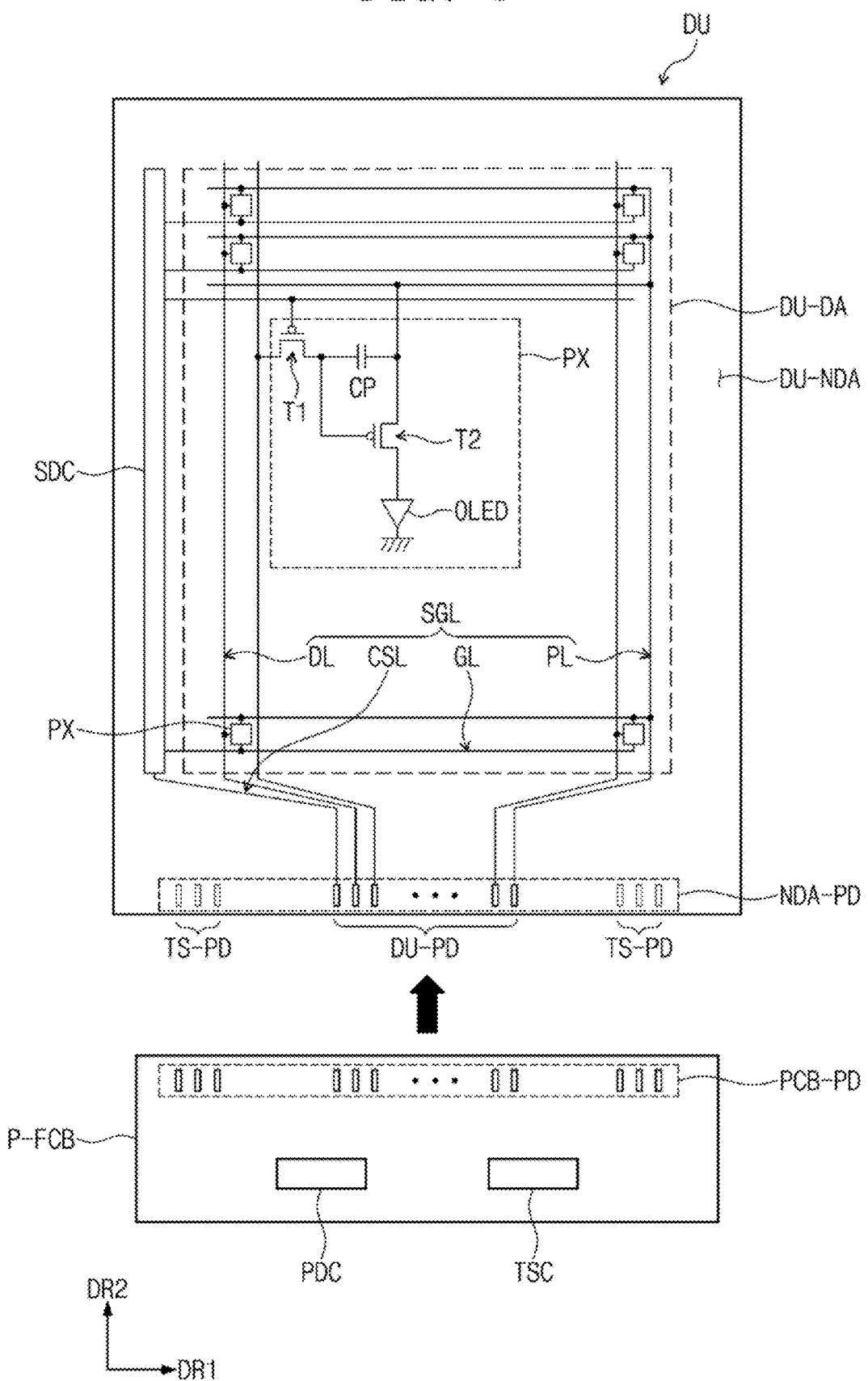
FIG. 5 is a plan view showing a display unit according to an exemplary embodiment of the present disclosure.

FIG. 5 is a plan view showing the display unit DU according to an exemplary embodiment of the present disclosure. FIG. 5 schematically shows a signal circuit diagram. For the convenience of explanation, some elements are omitted in FIG. 5.

Referring to FIG. 5, the display unit DU may include a display area DU-DA and a non-display area DU-NDA. In the present exemplary embodiment, the non-display area DU-NDA may be defined along an edge of the display area DU-DA. The display area DU-DA and the non-display area DU-NDA of the display unit DU may respectively correspond to the display area DA and the non-display area NDA of the display device DD shown in FIG. 1.

The display unit DU may include a scan driving circuit SDC, a plurality of signal lines SGL (hereinafter, referred to as "signal lines"), a plurality of signal pads DU-PD (hereinafter, referred to as "signal pads"), and a plurality of pixels PX (hereinafter, referred to as "pixels"). The pixels PX may be arranged in the display area DU-DA. Each of the pixels PX may include an organic light emitting diode and a pixel driving circuit connected to the organic light emitting diode.

The scan driving circuit SDC may generate a plurality of scan signals (hereinafter, referred to as "scan signals") and may sequentially output the scan signals to a plurality of scan lines GL (hereinafter, referred to as "scan lines") described later. The scan driving circuit SDC may further output other control signals to the pixel driving circuit of the pixels PX.

The scan driving circuit SDC may include a plurality of thin film transistors formed through the same processes, e.g., a low temperature polycrystalline silicon (LTPS) process or a low temperature polycrystalline oxide (LTPO) process, as the pixel driving circuit of the pixels PX.

The signal lines SGL may include the scan lines GL, data lines DL, a power line PL, and a control signal line CSL. Each of the scan lines GL may be connected to a corresponding pixel among the pixels PX, and each of the data lines DL may be connected to a corresponding pixel among the pixels PX. The power line PL may be connected to the pixels PX. The control signal line CSL may provide control signals to the scan driving circuit SDC.

The signal lines SGL may overlap the display area DU-DA and the non-display area DU-NDA. The signal lines SGL may include a pad part and a line part. The line part may overlap the display area DU-DA and the non-display area DU-NDA. The pad part may be connected to an end of the line part. The pad part may be disposed in the non-display area DU-NDA and may overlap a corresponding signal pad among the signal pads DU-PD. An area in which the signal pads DU-PD are arranged in the non-display area DU-NDA may be referred to as a "pad area NDA-PD".

The line part connected to the pixel PX may substantially form the signal lines SGL. The line part may be connected to the transistors (not shown) of the pixels PX. The line part may have a single-layer or multi-layer structure and may be formed in a single body or may include two or more portions. The two or more portions may be disposed on different layers and may be connected to each other through contact holes defined through an insulating layer disposed between the two or more portions.

The display unit DU may further include touch sensing pads TS-PD arranged in the pad area NDA-PD. The touch sensing pads TS-PD may be formed through the same process as the signal lines SGL, and thus, the touch sensing pads TS-PD may be disposed on the same layer as the signal lines SGL.

The touch sensing pads TS-PD may overlap the pad part of the signal lines included in the touch sensing unit TSU shown in FIGS. 3A and 3B. The touch sensing pads TS-PD may be electrically insulated from the signal lines SGL of the display unit DU.

FIG. 5 additionally shows the panel circuit board P-FCB electrically connected to the display unit DU. The panel circuit board P-FCB may be a rigid circuit board or a flexible circuit board. The panel circuit board P-FCB may be directly coupled to the display unit DU or may be connected to the display unit DU via another circuit board.

The panel driving circuit PDC may be disposed on the panel circuit board P-FCB to control the operation of the display unit DU. In addition, the touch sensing circuit TSC that controls the touch sensing unit TSU may be disposed on the panel circuit board P-FCB. Each of the panel driving circuit PDC and the touch sensing circuit TSC may be mounted on the panel circuit board P-FCB in the form of an integrated chip. The panel circuit board P-FCB may include circuit board pads PCB-PD electrically connected to the display unit DU. Although not shown in the drawing, the panel circuit board P-FCB may further include signal lines connecting the circuit board pads PCB-PD to the panel driving circuit PDC and to the touch sensing circuit TSC.

Figure 6:
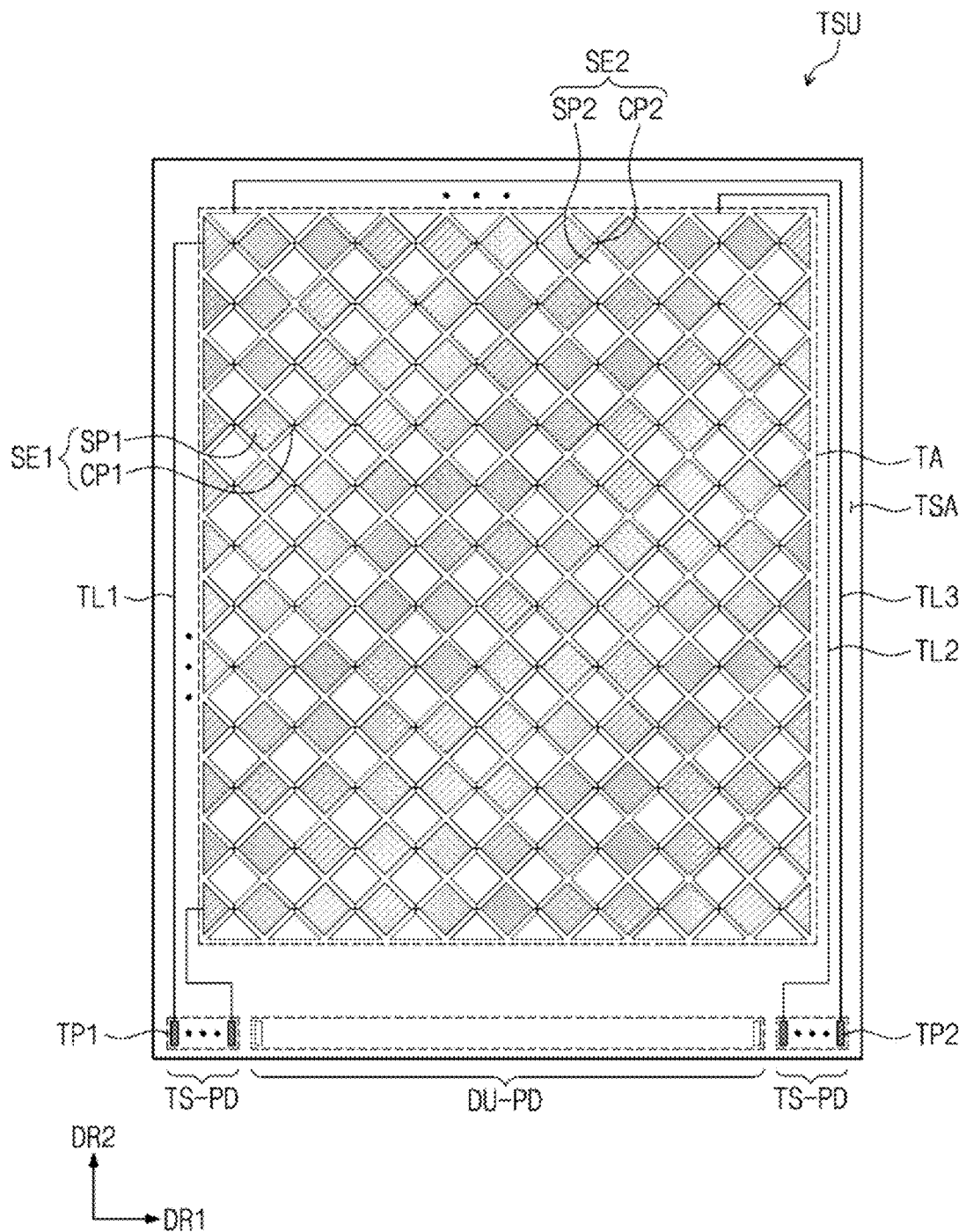
FIG. 6 is a plan view showing a touch sensing unit according to an exemplary embodiment of the present disclosure.

FIG. 6 is a plan view showing the touch sensing unit TSU according to an exemplary embodiment of the present disclosure.

Referring to FIG. 6, the touch sensing unit TSU may be disposed on the display unit DU shown in FIG. 5. The touch sensing unit TSU may sense the first input TC1 (refer to FIG. 1) to obtain information about position and intensity of the external touch input. The touch sensing unit TSU may include a touch area TA and a touch peripheral area TSA. In the present exemplary embodiment, the touch peripheral area TSA may be defined along an edge of the touch area TA. The touch area TA and the touch peripheral area TSA may respectively correspond to the display area DA and the non-display area NDA of the display device DD of FIG. 1.

The touch sensing unit TSU may include a plurality of first sensing electrodes SE1, a plurality of second sensing electrodes SE2, a plurality of sensing lines TL1, TL2, and TL3, and a plurality of touch sensing pads TS-PD.

The first sensing electrodes SE1 and the second sensing electrodes SE2 may be arranged in the touch area TA. The touch sensing unit TSU may obtain information about the touch input depending on a variation in capacitance between the first sensing electrodes SE1 and the second sensing electrodes SE2.

The first sensing electrodes SE1 may extend in the first direction DR1 and may be arranged in the second direction DR2. The first sensing electrodes SE1 may include a plurality of first sensing patterns SP1 and a plurality of first connection patterns CP1.

The first sensing patterns SP1 that form one first sensing electrode may be arranged in the first direction DR1 to be spaced apart from each other. For the convenience of explanation, the first sensing patterns SP1 are shown shaded. The first connection patterns CP1 may be disposed between the first sensing patterns SP1 to connect two first sensing patterns SP1 adjacent to each other. In an example embodiment, the first connection patterns CP1 may be disposed between the first sensing patterns SP1 to connect two first sensing patterns SP1 adjacent to each other in the first direction DR1.

The second sensing electrodes SE2 may extend in the second direction DR2 and may be arranged in the first direction DR1. The second sensing electrodes SE2 may include a plurality of second sensing patterns SP2 and a plurality of second connection patterns CP2.

The second sensing patterns SP2 that form one second sensing electrode may be arranged in the second direction DR2 to be spaced apart from each other. The second connection patterns CP2 may be disposed between the second sensing patterns SP2 to connect two second sensing patterns SP2 adjacent to each other. In an example embodiment, the second connection patterns CP2 may be disposed between the second sensing patterns SP2 to connect two second sensing patterns SP2 adjacent to each other in the second direction DR2.

The sensing lines TL1, TL2, and TL3 may be disposed in the touch peripheral area TSA. The sensing lines TL1, TL2, and TL3 may include first sensing lines TL1, second sensing lines TL2, and third sensing lines TL3. The first sensing lines TL1 may be respectively connected to the first sensing electrodes SE1. The second sensing lines TL2 may be respectively connected to one ends of the second sensing electrodes SE2.

The third sensing lines TL3 may be respectively connected to the other ends of the second sensing electrodes SE2. The other ends of the second sensing electrodes SE2 may be portions opposite to the one ends of the second sensing electrodes SE2. According to the present disclosure, the second sensing electrodes SE2 may be connected to the second sensing lines TL2 and the third sensing lines TL3. Accordingly, it is possible to uniformly maintain a sensitivity with respect to area of the second sensing electrode SE2 having a relatively longer length than that of the first sensing electrode SE1. Meanwhile, this is merely exemplary. The third sensing lines TL3 may be omitted, and the present disclosure should not be limited to a particular embodiment.

The touch sensing pads TS-PD may be disposed in the touch peripheral area TSA. The touch sensing pads TS-PD may include a first sensing pad TP1 and a second sensing pad TP2. The first sensing pad TP1 may be connected to the first sensing line TL1 to apply an external signal to the first sensing electrode SE1. The second sensing pad TP2 may be electrically connected to the second sensing electrode SE2 via the second sensing line TL2.

Figure 7:
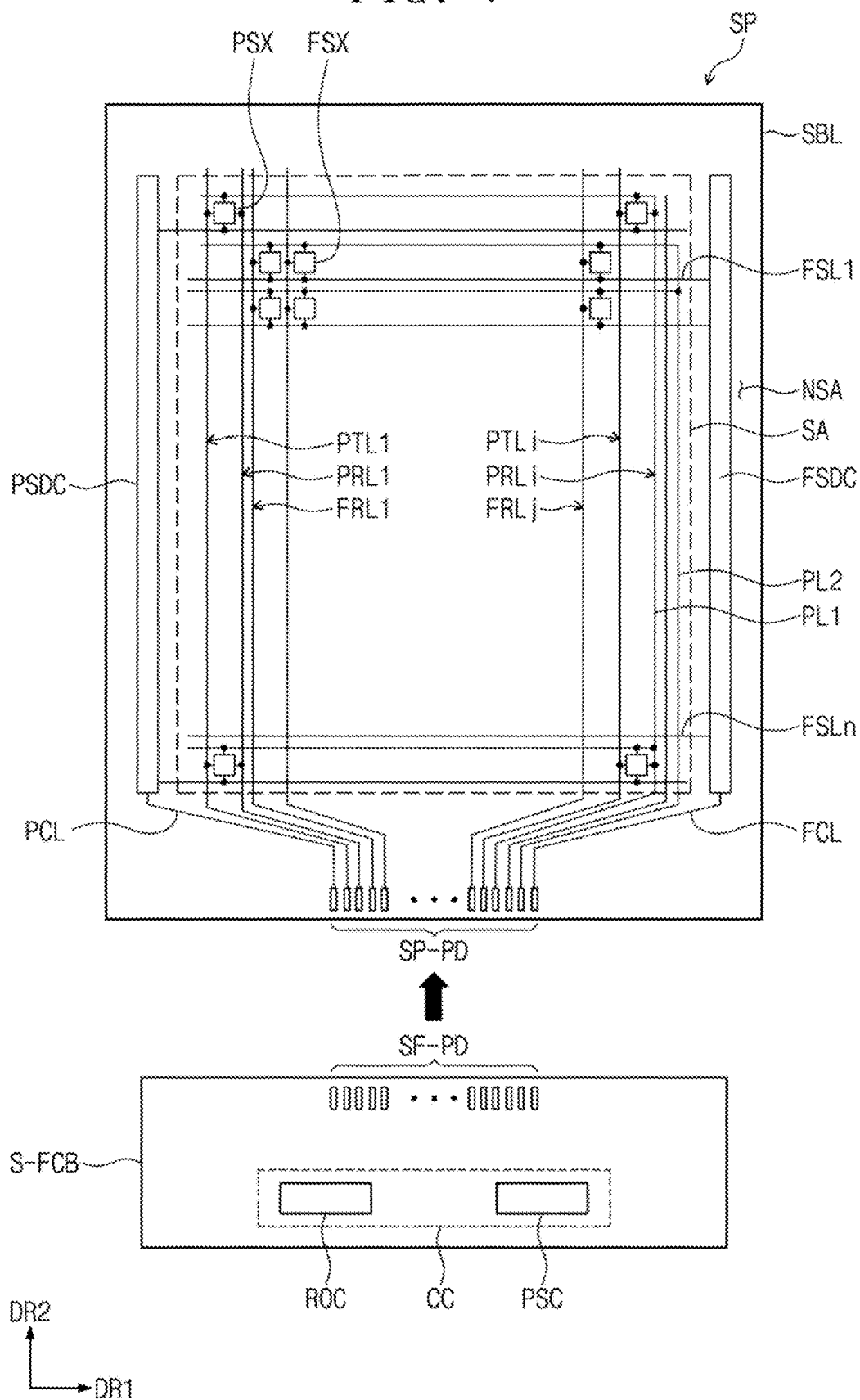
FIG. 7 is a plan view showing a fingerprint sensing panel according to an exemplary embodiment of the present disclosure.

FIG. 7 is a plan view showing a fingerprint sensing panel according to an exemplary embodiment of the present disclosure.

Referring to FIG. 7, the sensing panel SP may sense the light reflected by the first input TC1 (refer to FIG. 1) to obtain user's fingerprint information. In addition, the sensing panel SP may receive a signal by the second input TC2 (refer to FIG. 1) to obtain coordinate information of the second input TC2.

The sensing panel SP may include a sensing area SA and a non-sensing area NSA on the sensing base layer SBL. The non-sensing area NSA may be defined along an edge of the sensing area SA. The sensing area SA and the non-sensing area NSA of the sensing panel SP may respectively correspond to the display area DA and the non-display area NDA of the display device DD shown in FIG. 1. For example, the sensing area SA and the non-sensing area NSA of the sensing panel SP may respectively overlap the display area DA and the non-display area NDA of the display device DD shown in FIG. 1. Therefore, the display area DA of the display device DD shown in FIG. 1, the display area DU-DA of the display unit DU shown in FIG. 5, the touch area TA of the touch sensing unit TSU shown in FIG. 6, and the sensing area SA of the sensing panel SP shown in FIG. 7 may correspond to each other. For example, the touch area TA of the touch sensing unit TSU and the sensing area SA of the sensing panel SP may overlap each other. Similarly, the non-display area NDA of the display device DD shown in FIG. 1, the non-display area DU-NDA of the display unit DU shown in FIG. 5, the touch peripheral area TSA of the touch sensing unit TSU shown in FIG. 6, and the non-sensing area NSA of the sensing panel SP shown in FIG. 7 may correspond to each other. For example, the touch peripheral area TSA of the touch sensing unit TSU and the non-sensing area NSA of the sensing panel SP may overlap each other.

The sensing panel SP may include a pen scan driving circuit PSDC, a fingerprint scan driving circuit FSDC, a plurality of pen sensing pixels PSX, a plurality of fingerprint sensing pixels FSX, a pen scan control line PCL, pen scan lines PSL1 to PSLm, pen transmission lines PTL1 to PTLi, pen receiving lines PRL1 to PRLi, a fingerprint scan control line FCL, fingerprint scan lines FSL1 to FSLn, fingerprint receiving lines FRL1 to FRLj, a first power line PL1, a second power line PL2, and a plurality of sensing pads SP-PD. In FIG. 7, the sensing panel SP includes two power lines PL1 and PL2, however, the sensing panel SP may further include a plurality of power lines to provide a plurality of voltages needed for the operation of the pen sensing pixels PSX and the fingerprint sensing pixels FSX.

The pen sensing pixels PSX and the fingerprint sensing pixels FSX may be disposed in the sensing area SA. The pen sensing pixels PSX may be connected to the pen scan lines PSL1 to PSLm, the pen transmission lines PTL1 to PTLi, the pen receiving lines PRL1 to PRLi, and the first power line PL1. The fingerprint sensing pixels FSX may be connected to fingerprint scan lines FSL1 to FSLn, the fingerprint receiving lines FRL1 to FRLj, and the second power line PL2.

The pen scan driving circuit PSDC and the fingerprint scan driving circuit FSDC may be disposed in the non-sensing area NSA. In the exemplary embodiment, the pen scan driving circuit PSDC and the fingerprint scan driving circuit FSDC may be disposed to be spaced apart from each other with the sensing area SA interposed therebetween.

The sensing pads SP-PD may be arranged in the non-sensing area NSA. The sensing pads SP-PD may be electrically connected to the pen scan control line PCL, the pen transmission lines PTL1 to PTLi, the pen receiving lines PRL1 to PRLi, the fingerprint scan control line FCL, the fingerprint receiving lines FRL1 to FRLj, the first power line PL1, and the second power line PL2.

FIG. 7 additionally shows the sensing circuit board S-FCB electrically connected to the sensing panel SP. The sensing circuit board S-FCB may be a rigid circuit board or a flexible circuit board. The sensing circuit board S-FCB may be directly coupled to the sensing panel SP or may be electrically connected to the sensing panel SP via another circuit board.

The sensing circuit board S-FCB may include a control circuit CC. The control circuit CC may include the fingerprint readout circuit ROC and the pen sensing circuit PSC, which control the operation of the sensing panel SP. In addition, sensing board pads SF-PD may be disposed in the sensing circuit board S-FCB. Although not shown in the drawing, the sensing circuit board S-FCB may further include signal lines that connect the sensing board pads SF-PD to the fingerprint readout circuit ROC and the pen sensing circuit PSC.

The sensing board pads SF-PD of the sensing circuit board S-FCB may be connected to the sensing pads SP-PD of the sensing panel SP. Thus, the fingerprint readout circuit ROC and the pen sensing circuit PSC of the sensing circuit board S-FCB may be electrically connected to the sensing panel SP via the sensing board pads SF-PD and the sensing pads SP-PD.

In the exemplary embodiment, each of the fingerprint readout circuit ROC and the pen sensing circuit PSC may be mounted on the sensing circuit board S-FCB after being independently implemented in an integrated circuit IC. According to another exemplary embodiment, the control circuit CC including the fingerprint readout circuit ROC and the pen sensing circuit PSC may be implemented in a single integrated circuit IC.

Figure 8:
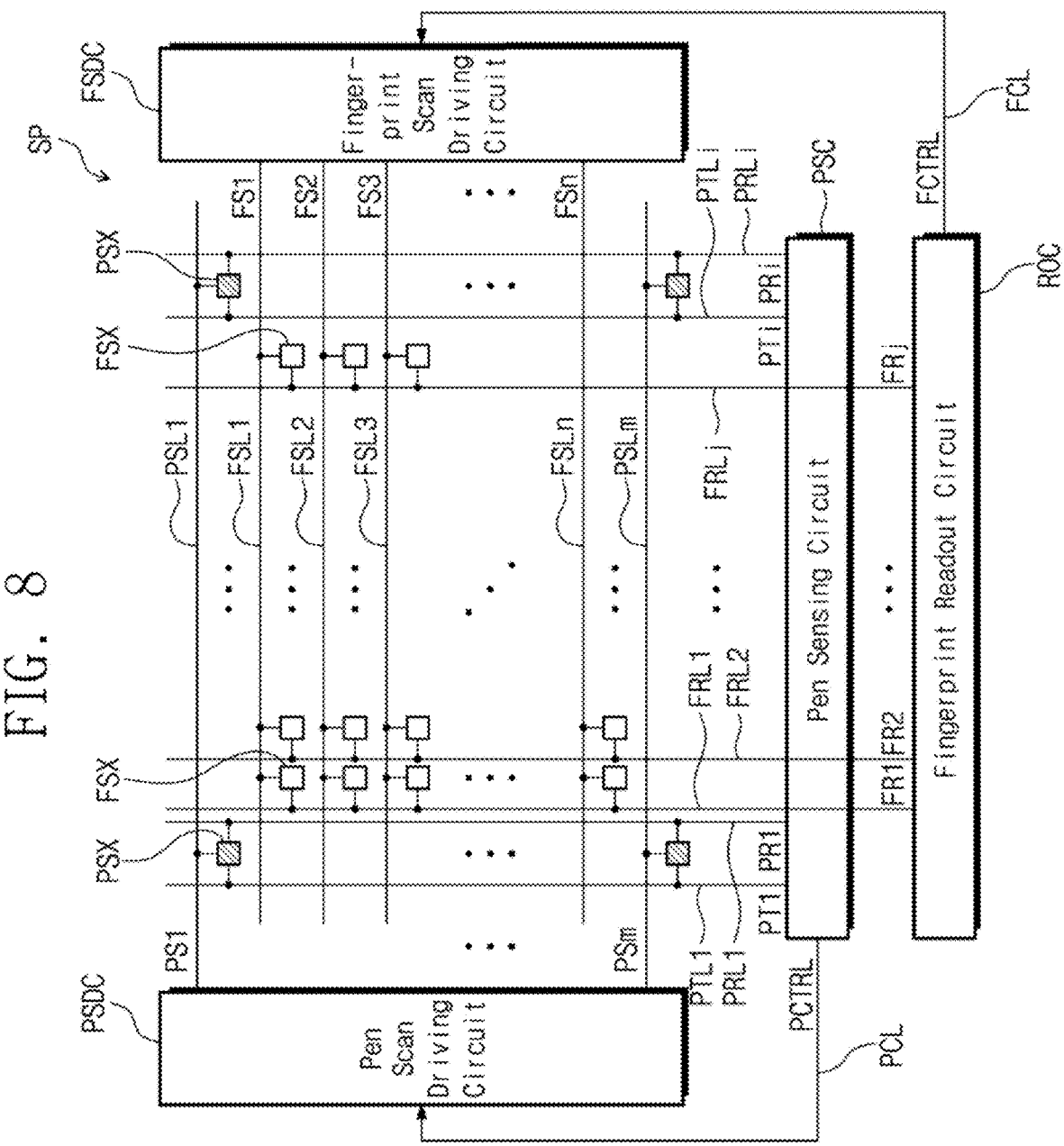
FIG. 8 is view showing a connection relationship between pen sensing pixels, a pen scan driving circuit, and a pen sensing circuit and a connection relationship between fingerprint sensing pixels, a fingerprint sensing scan circuit, and a fingerprint readout circuit.

FIG. 8 is view showing a connection relationship between the pen sensing pixels PSX, the pen scan driving circuit PSDC, and the pen sensing circuit PSC, which are provided in the sensing panel SP, and a connection relationship between the fingerprint sensing pixels FSX, the fingerprint scan driving circuit FSDC, and the fingerprint readout circuit ROC, which are provided in the sensing panel SP. Although not shown in FIG. 8, the sensing panel SP may further include the power lines to provide the voltages needed for the operation of the pen sensing pixels PSX and the fingerprint sensing pixels FSX.

Referring to FIG. 8, each of the pen sensing pixels PSX may be connected to a corresponding pen scan line among the pen scan lines PSL1 to PSLm, a corresponding pen transmission line among the pen transmission lines PTL1 to PTLm, and a corresponding pen receiving line among the pen receiving lines PRL1 to PRLi.

The pen sensing circuit PSC may provide a pen scan control signal PCTRL to the pen scan driving circuit PSDC via the pen scan control line PCL. The pen scan control signal PCTRL may include a scan start signal and/or clock signals to control an operation of the pen scan driving circuit PSDC.

The pen scan driving circuit PSDC may generate a plurality of pen scan signals PS1 to PSm in synchronization with the pen scan control signal PCTRL and may sequentially output the pen scan signals PS1 to PSm to the pen scan lines PSL1 to PSLm. The pen scan driving circuit PSDC may further output another control signal to the pen sensing pixels PSX.

The fingerprint scan driving circuit FSDC may generate a plurality of fingerprint scan signals FS1 to FSn in synchronization with a fingerprint scan control signal FCTRL and may sequentially output the fingerprint scan signals FS1 to FSn to the fingerprint scan lines FSL1 to FSLn. The fingerprint scan driving circuit FSDC may further output another control signal to the fingerprint sensing pixels FSX.

In the present exemplary embodiment, the sensing panel SP includes one fingerprint scan driving circuit FSDC and one pen scan driving circuit PSDC, however, it should not be limited thereto or thereby. For example, the sensing panel SP may include two fingerprint scan driving circuits and/or two pen scan driving circuits, which are disposed in the non-sensing area NSA to face each other with the sensing area SA interposed therebetween.

The pen sensing circuit PSC may provide pen transmission signals PT1 to PTi to the pen transmission lines PTL1 to PTLm and may receive the pen receiving signals PR1 to PRi from the pen receiving lines PRL1 to PRLi.

Each of the fingerprint sensing pixels FSX may be connected to a corresponding fingerprint scan line among the fingerprint scan lines FSL1 to FSLn and a corresponding fingerprint receiving line among the fingerprint receiving lines FRL1 to FRLj.

The fingerprint readout circuit ROC may provide the fingerprint scan control signal FCTRL to the fingerprint scan driving circuit FSDC via the fingerprint scan control line FCL. The fingerprint scan control signal FCTRL may include a scan start signal and/or clock signals to control an operation of the fingerprint scan driving circuit FSDC.

The fingerprint scan driving circuit FSDC may sequentially drive the fingerprint scan lines FSL1 to FSLn in synchronization with the fingerprint scan control signal FCTRL.

The fingerprint readout circuit ROC may receive the fingerprint receiving signals FR1 to FRj from the fingerprint receiving lines FRL1 to FRLj.

As shown in FIGS. 7 and 8, the sensing panel SP may include the fingerprint sensing pixels FSX and the pen sensing pixels PSX. Accordingly, the sensing panel SP may sense the fingerprint by the first input TC1 of the user and the second input TC2 by the electronic pen EP. In addition, since the fingerprint scan driving circuit FSDC and the fingerprint readout circuit ROC, which are used to drive the fingerprint sensing pixels FSX, and the pen scan driving circuit PSDC and the pen sensing circuit PSC, which are used to drive the pen sensing pixels PXS, operate separately, the sensing panel SP may receive the first input TC1 and the second input TC2 substantially at the same time. For example, the sensing panel SP may perform the fingerprint sensing operation with respect to the first input TC1 and the sensing operation with respect to the second input TC2 from the electronic pen EP substantially at the same time.

Figure 9A:
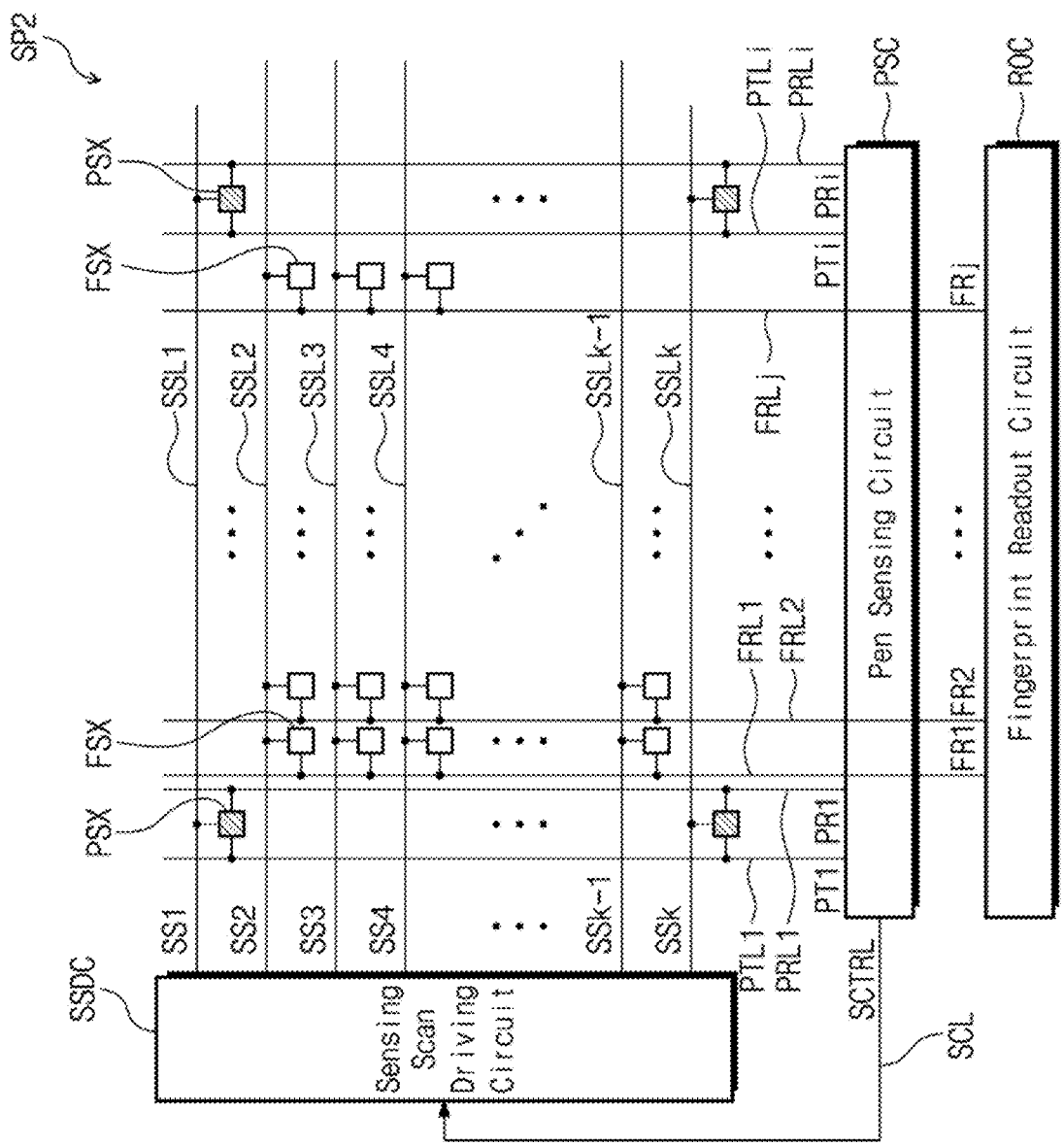
FIG. 9A is a view showing a circuit configuration of a sensing panel according to another exemplary embodiment of the present disclosure.

FIG. 9A is a view showing a circuit configuration of a sensing panel SP2 according to an exemplary embodiment of the present disclosure.

In the sensing panel SP shown in FIGS. 7 and 8, the pen scan driving circuit PSDC to drive the pen sensing pixels PSX and the fingerprint scan driving circuit FSDC to drive the fingerprint sensing pixels FSX are provided separately from each other. In the case of the sensing panel SP2 shown in FIG. 9A, all the pen sensing pixels PSX and the fingerprint sensing pixels FSX may be driven by a sensing scan driving circuit SSDC.

A pen sensing circuit PSC may provide a scan control signal SCTRL to the sensing scan driving circuit SSDC via a scan control line SCL. The scan control signal SCTRL may include a scan start signal and/or clock signals to control an operation of the sensing scan driving circuit SSDC. According to an embodiment, instead of the pen sensing circuit PSC, a fingerprint readout circuit ROC may provide the scan control signal SCTRL to the sensing scan driving circuit SSDC.

The sensing scan driving circuit SSDC may generate a plurality of sensing scan signals SS1 to SSk in synchronization with the scan control signal SCTRL and may sequentially output the sensing scan signals SS1 to SSk to a plurality of sensing scan lines SSL1 to SSLk.

In a case where the number of the pen sensing pixels PSX and the number of the fingerprint sensing pixels FSX shown in FIG. 8 are respectively the same as the number of the pen sensing pixels PSX and the number of the fingerprint sensing pixels FSX shown in FIG. 9A, the number (k) of the sensing scan lines SSL1 to SSLk shown in FIG. 9A may be the sum of the number (m) of the pen scan lines PSL1 to PSLm and the number (n) of the fingerprint scan lines FSL-1 and FSLn shown in FIG. 8 (k=m+n, each of k, m, and n is a natural number).

The configuration and operation of the pen sensing pixels PSX, the fingerprint sensing pixels FSX, the pen sensing circuit PSC, and the fingerprint readout circuit ROC of the sensing panel SP2 shown in FIG. 9A may be substantially the same as those described in FIG. 8, and thus, details thereof will be omitted.

Figure 9B:
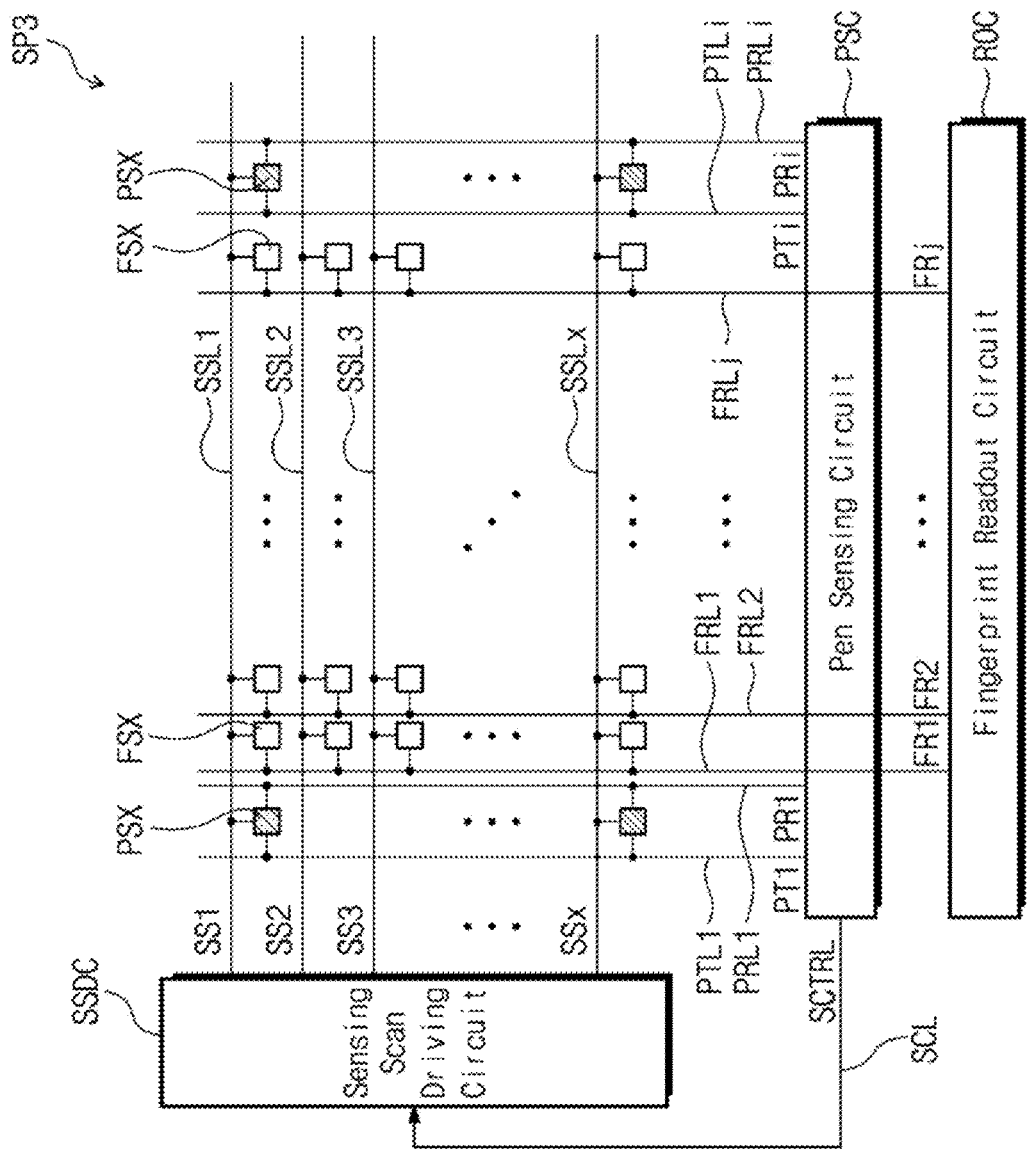
FIG. 9B is a view showing a circuit configuration of a sensing panel according to another exemplary embodiment of the present disclosure.

FIG. 9B is a view showing a circuit configuration of a sensing panel SP3 according to an exemplary embodiment of the present disclosure.

In the case of the sensing panel SP3 shown in FIG. 9B, a plurality of pen sensing pixels PSX and a plurality of fingerprint sensing pixels FSX may be driven by a sensing scan driving circuit SSDC.

A pen sensing circuit PSC may provide a scan control signal SCTRL to the sensing scan driving circuit SSDC via a scan control line SCL. The scan control signal SCTRL may include a scan start signal and/or clock signals to control an operation of the sensing scan driving circuit SSDC. According to an embodiment, instead of the pen sensing circuit PSC, a fingerprint readout circuit ROC may provide the scan control signal SCTRL to the sensing scan driving circuit SSDC.

The sensing scan driving circuit SSDC may generate a plurality of sensing scan signals SS1 to SSx in synchronization with the scan control signal SCTRL and may sequentially output the sensing scan signals SS1 to SSx to a plurality of sensing scan lines SSL1 to SSLx.

Some of the sensing scan lines SSL1 to SSLx may be commonly connected to the pen sensing pixels PSX and the fingerprint sensing pixels FSX. For example, the pen sensing pixels PSX and the fingerprint sensing pixels FSX may be commonly connected to a sensing scan line SSL1, and the pen sensing pixels PSX and the fingerprint sensing pixels FSX may be commonly connected to a sensing scan line SSLx.

In a case where the number of the pen sensing pixels PSX and the number of the fingerprint sensing pixels FSX shown in FIG. 9A are respectively the same as the number of the pen sensing pixels PSX and the number of the fingerprint sensing pixels FSX shown in FIG. 9B, the number (x) of the sensing scan lines SSL1 to SSLx shown in FIG. 9B may be smaller than the number (k) of the sensing scan lines SSL1 to SSLk shown in FIG. 9A (k>x, each of k and x is a natural number). In an example embodiment, the number (x) may be smaller than the number (k) by 2.

Hereinafter, for the convenience of explanation, the sensing scan lines connected to the fingerprint sensing pixels FSX will be referred to as "fingerprint scan lines" and the sensing scan lines connected to the pen sensing pixel PSX will be referred to as "pen scan lines", however, the fingerprint scan line and the pen scan line may be driven by one sensing scan driving circuit SSDC shown in FIGS. 9A and 9B without distinction between them.

Figure 10:
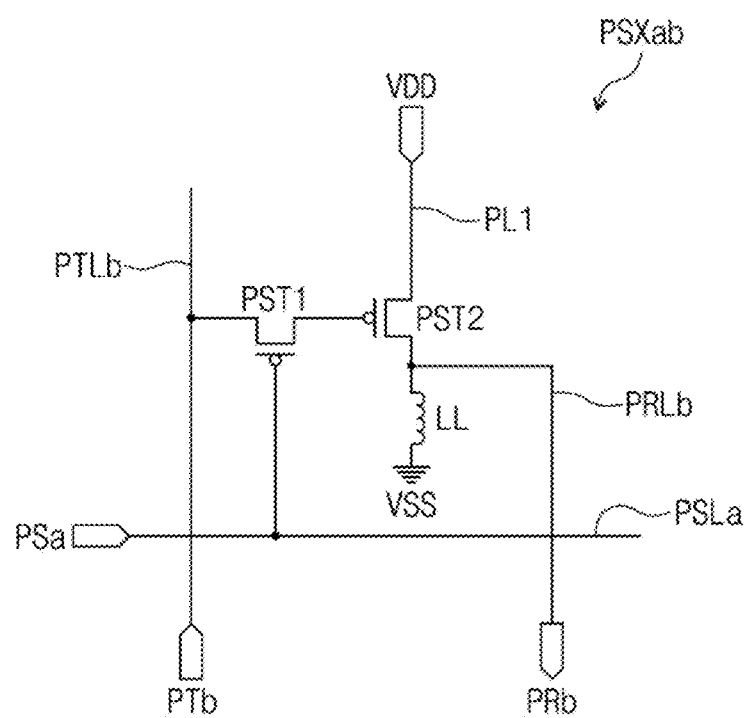
FIG. 10 is a circuit diagram showing a pen sensing pixel.
Figure 11:
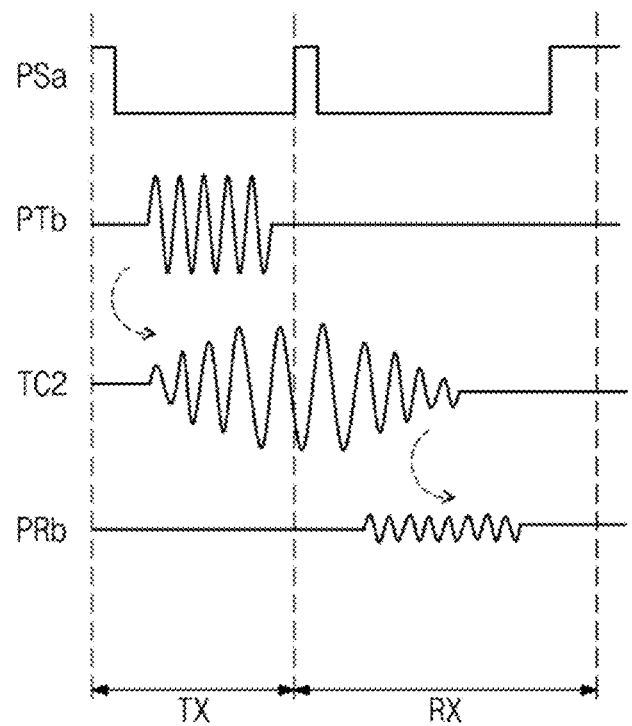
FIG. 11 is a timing diagram showing an operation of the pen sensing pixel shown in FIG. 10.

FIG. 10 is a circuit diagram showing a pen sensing pixel PSXab. FIG. 11 is a timing diagram showing an operation of the pen sensing pixel PSXab shown in FIG. 10.

The pen sensing pixel PSXab shown in FIG. 10 may be electrically connected to an a-th pen scan line PSLa, a b-th pen transmission line PTLb, and a b-th pen receiving line PRLb.

Referring to FIG. 10, the pen sensing pixel PSXab may include a first switching transistor PST1, a second switching transistor PST2, and a sensing coil LL (or inductor). The first switching transistor PST1 may include a first electrode connected to the pen transmission line PTLb, a second electrode connected to a gate electrode of the second switching transistor PST2, and a gate electrode connected to the pen scan line PSLa. The second switching transistor PST2 may include a first electrode connected to the first power line PL1, a second electrode connected to one end of the sensing coil LL, and the gate electrode connected to the second electrode of the first switching transistor PST1. The second electrode of the second switching transistor PST2 may be also connected to the pen receiving line PRLb. The first power line PL1 may receive a power supply voltage VDD. The one end of the sensing coil LL may be connected to the second electrode of the second switching transistor PST2, and the other end of the sensing coil LL may be connected to a ground voltage terminal VSS.

In the exemplary embodiment shown in FIG. 10, each of the first switching transistor PST1 and the second switching transistor PST2 may be a p-type metal-oxide-semiconductor (PMOS) transistor, however, it should not be limited thereto or thereby. According to an embodiment, each of the first switching transistor PST1 and the second switching transistor PST2 may be an n-type metal-oxide-semiconductor (NMOS) transistor.

Referring to FIGS. 10 and 11, when a pen scan signal PSa having an active level, for example, a low level, is applied to the pen scan line PSLa during a transmission period TX, the first switching transistor PST1 may be turned on. For example, when a predetermined pen transmission signal PTb is applied to the pen transmission line PTLb, the second switching transistor PST2 may be repeatedly turned on and off by the pen transmission signal PTb, and a current may flow through the sensing coil LL, thereby forming a magnetic field. A magnitude of a resonance signal sensed at the one end of the sensing coil LL may be changed depending on presence or absence of the second input TC2. The pen sensing circuit PSC (refer to FIG. 8) may receive a pen receiving signal PRb via the pen receiving line PRLb. For example, the pen sensing circuit PSC (refer to FIG. 8) may receive a pen receiving signal PRb via the pen receiving line PRLb during a reception period RX according to a level of the resonance signal. As described above, the pen sensing pixel PSXab of the present disclosure may receive the second input TC2 from the electronic pen EP shown in FIG. 1 in an electromagnetic resonance (EMR) method.

Figure 12:
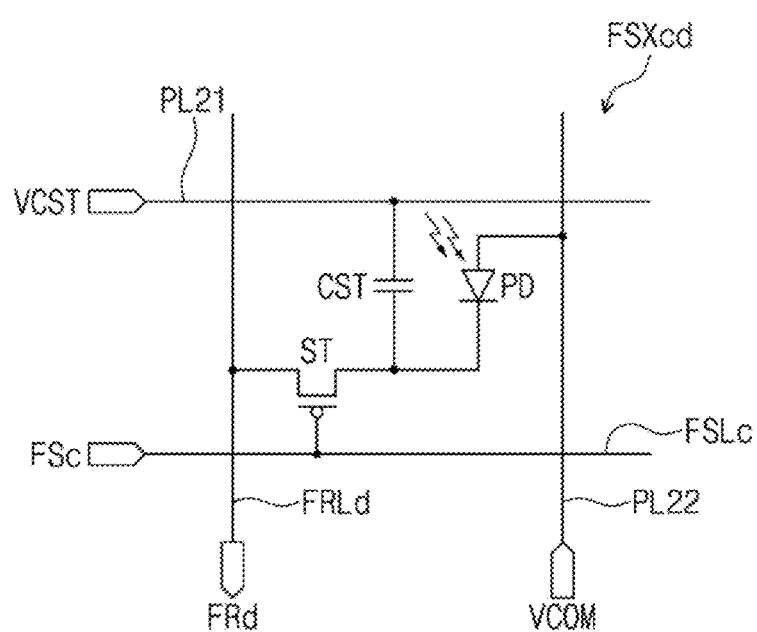
FIG. 12 is a circuit diagram showing a fingerprint sensing pixel.

FIG. 12 is a circuit diagram showing a fingerprint sensing pixel FSXcd.

The fingerprint sensing pixel FSXcd shown in FIG. 12 may be electrically connected to a c-th fingerprint scan line FSLc and a d-th fingerprint receiving line FRLd.

Referring to FIG. 12, the fingerprint sensing pixel FSXcd may include a switching transistor ST, a capacitor CST, and a photodiode PD. The switching transistor ST may include a first electrode connected to the fingerprint receiving line FRLd, a second electrode connected to one end of the capacitor CST, and a gate electrode connected to the fingerprint scan line FSLc. The one end of the capacitor CST may be connected to the second electrode of the switching transistor ST, and the other end of the capacitor CST may be connected to a first voltage line PL21 to which a first voltage VCST is applied. The photodiode PD may include an anode connected to a second voltage line PL22 and a cathode connected to the second electrode of the switching transistor ST.

A current may flow through the photodiode PD when a light is applied to the photodiode PD, and a level of the voltage may be almost proportional to an amount of the light. Electric charges generated by the photodiode PD may be charged in the capacitor CST. When the fingerprint scan signal FSc having the low level is received through the fingerprint scan line FSLc, the switching transistor ST may be turned on, and the electric charges charged in the capacitor CST may be discharged, thereby outputting a fingerprint sensing signal via the fingerprint receiving line FRLd.

The fingerprint sensing pixel FSXcd shown in FIG. 12 is merely exemplary, and the present disclosure should not be limited thereto or thereby. According to an embodiment, the fingerprint sensing pixel FSXcd may include two switching transistors.

Figure 13A:
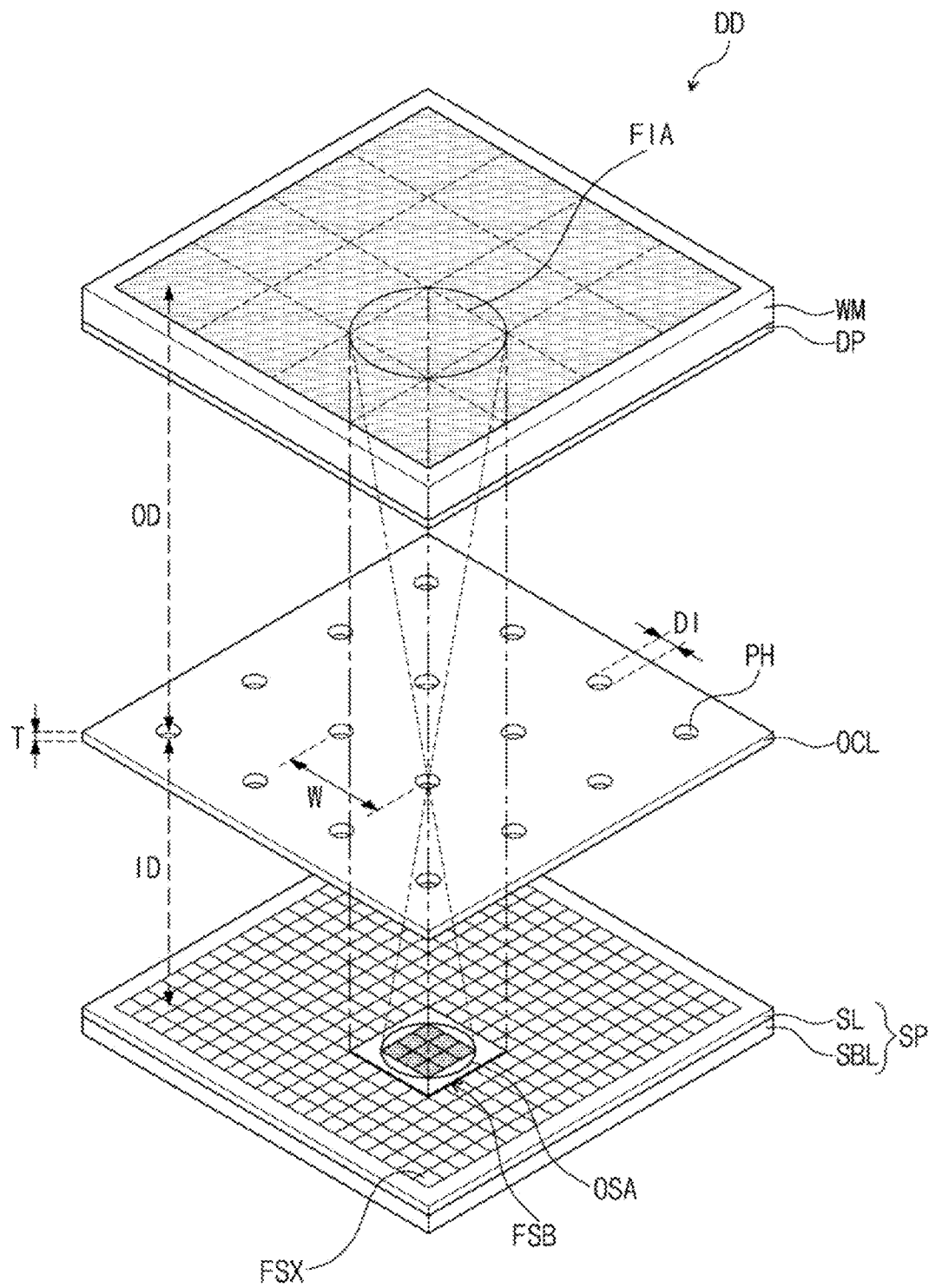
FIG. 13A is a perspective view showing a display device to explain a fingerprint sensing method of a sensing panel.

FIG. 13A is a perspective view showing the display device DD to explain a fingerprint sensing method of a sensing panel.

FIG. 13A shows only some components of the display device DD shown in FIG. 3B, which relate to the fingerprint sensing operation. The display device DD may include the window member WM, the display unit DU, the optical layer OCL, and the sensing panel SP. The sensing panel SP may include the sensing base layer SBL and the sensing layer SL. The optical layer OCL may be disposed between the display unit DU and the sensing panel SP.

The fingerprint sensing pixels FSX, the pen sensing pixels PSX, the fingerprint scan driving circuit FSDC, and the pen scan driving circuit PSDC described with reference to FIGS. 7 to 12 may be disposed on the sensing layer SL above the sensing base layer SBL.

In addition, the fingerprint sensing pixels FSX may be a fingerprint sensor operated in an optical manner in which the fingerprint is recognized by sensing a light reflected by a valley between ridges through an image sensor. The optical layer OCL may include the transmission pin holes PH that transmit the light reflected by the fingerprint of the first input TC1 (refer to FIG. 1). For example, the transmission pin holes PH of the optical layer OCL may be transmissive. In an example embodiment, each of the transmission pin holes PH may have a diameter D1, and the transmission pin holes PH may be spaced apart from each other at a pitch W. On the other hand, a portion of the optical layer OCL where the transmission pin holes PH are not formed may include an opaque material to block the light traveling thereto. In addition, the optical layer OCL may be formed of a material having a low reflectivity according to an exemplary embodiment. In an example embodiment, the optical layer OCL may have a predetermined thickness T.

In the exemplary embodiment, the optical layer OCL may be disposed to be substantially parallel to the display panel DP and the sensing panel SP. Each of the transmission pin holes PH of the optical layer OCL may overlap some of the fingerprint sensing pixels FSX provided to the sensing panel SP. Accordingly, the light from the pixels of the display panel DP may be provided to a fingerprint input area FIA defined on the window member WM. The light reflected by the fingerprint of the first input TC1 (refer to FIG. 1) may travel back to the fingerprint input area FIA and may be provided to a light sensing area OSA of the sensing panel SP within an angle of view (i.e., a viewing angle) that is formed by the pin hole PH of the optical layer OCL. Therefore, the light may be provided to the sensing panel SP even without a separate light guide member to control a path of light reflected by the fingerprint of the first input TC1.

The fingerprint sensing pixels FSX shown in FIGS. 8 and 12 may sense the lights reflected from different areas of the fingerprint and may generate electrical signals corresponding to the sensed lights. Each of the fingerprint sensing pixels FSX may generate the electric signal corresponding to the light reflected from the ridge of the fingerprint or may generate the electric signal corresponding to the light reflected from the valley between the ridges of the fingerprint. The amount of the light sensed by the photodiode PD (refer to FIG. 12) may differ depending on the shape of the fingerprint by which the light is reflected, and the electric signals having different levels from each other may be generated depending on the amount of the sensed light. For example, each of the fingerprint receiving signals FR1 to FRj from the fingerprint sensing pixels FSX may include contrast information (or image information), the fingerprint readout circuit ROC may perform a processing operation on the fingerprint receiving signals FR1 to FRj to determine whether the area corresponding to each fingerprint sensing pixel FSX is the ridge or valley, and an overall fingerprint image may be formed by combining the determined information.

Figure 13B:
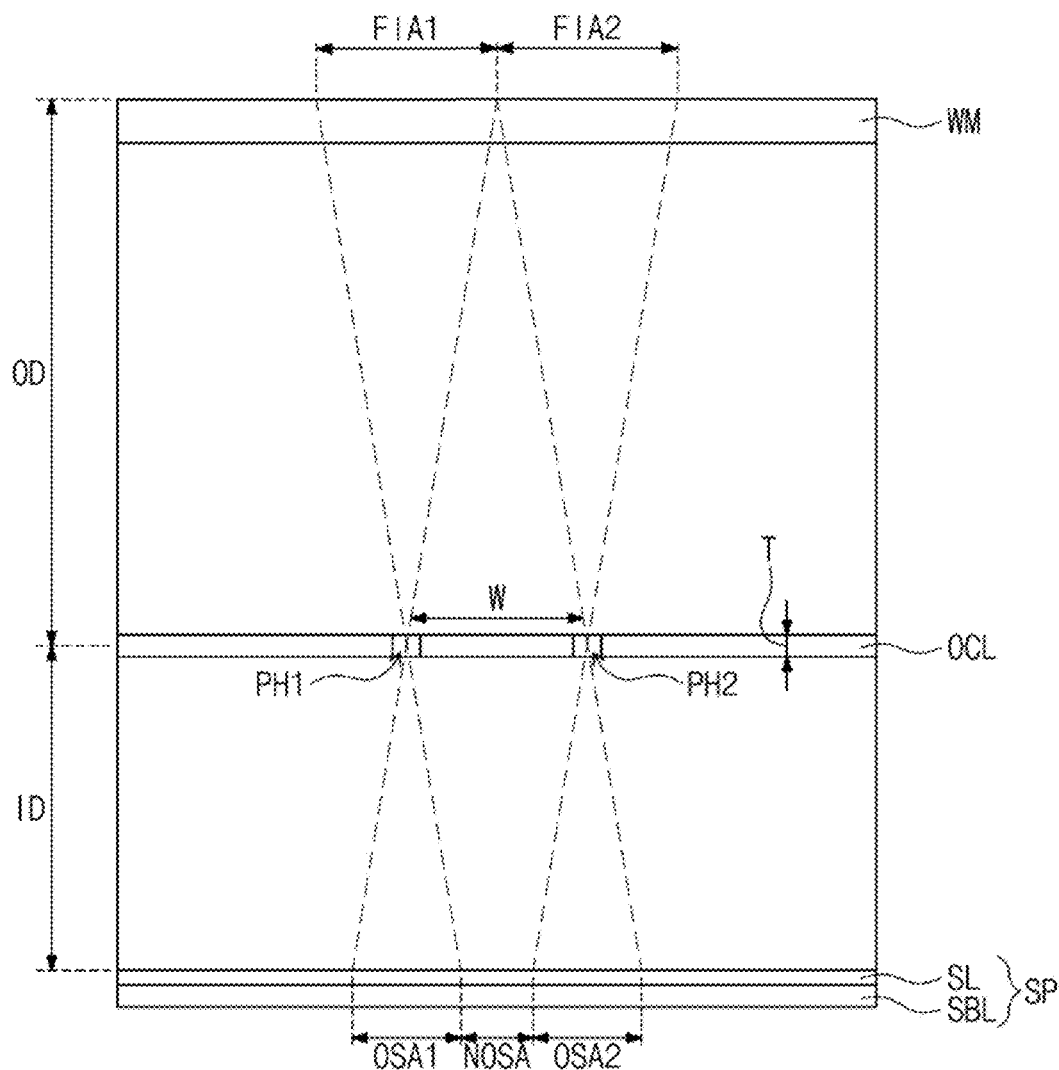
FIG. 13B is a cross-sectional view showing the display device shown in FIG. 13A.

FIG. 13B is a cross-sectional view showing the display device shown in FIG. 13A.

Referring to FIGS. 13A and 13B, a shape and a size of each of the fingerprint input areas FIA1 and FIA2 and each of the optical sensing areas OSA1 and OSA2 corresponding to the pin hole PH may be determined depending on a distance (object distance) OD between the window member WM and the optical layer OCL, a distance (image distance) ID between the optical layer OCL and the sensing panel SP, the thickness T of the optical layer OCL, the diameter DI of the pin hole PH, and a shape of the pin hole PH. The fingerprint input areas FIA1 and FIA2 and the optical sensing areas OSA1 and OSA2 may respectively correspond the transmission pin holes PH1 and PH2. In an example embodiment, the sensing base layer SBL may include the optical sensing areas OSA1 and OSA2. Each of the optical sensing areas OSA1 and OSA2 may be defined based on the viewing angle of a corresponding one of the transmission pin holes PH1 and PH2.

As shown in FIG. 13A, the transmission pin holes PH may be disposed to be spaced apart from each other by a predetermined distance in the first and second directions DR1 and DR2. For example, as shown in FIG. 13B, a non-optical-sensing area NOSA may exist between two optical sensing areas OSA1 and OSA2 adjacent to each other due to a distance between centers of two transmission pin holes PH1 and PH2 adjacent to each other, i.e., the pitch W.

Figure 13C:
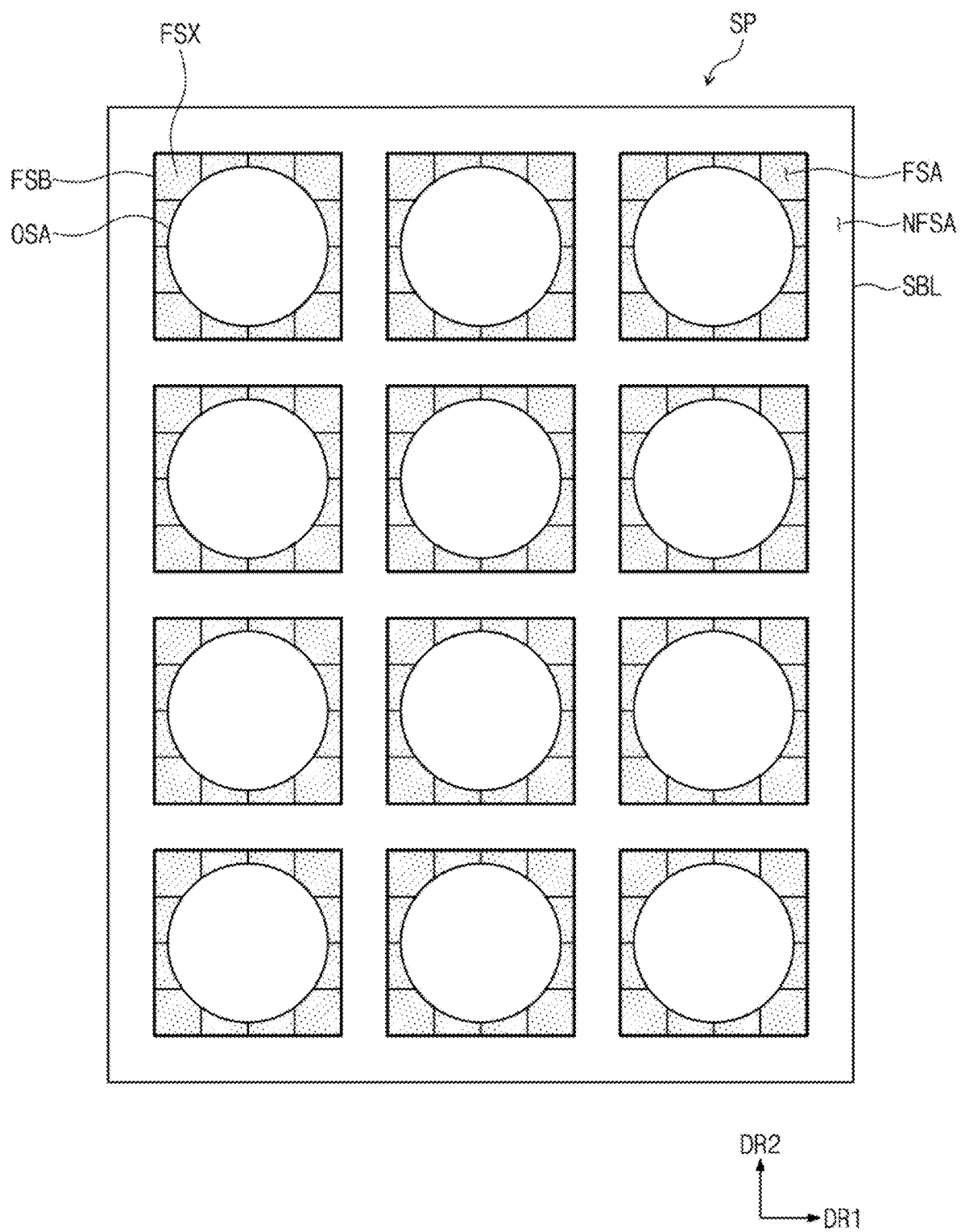
FIG. 13C is a view showing fingerprint sensing pixels, optical sensing areas, and fingerprint sensing blocks of a sensing panel.

FIG. 13C is a view showing fingerprint sensing pixels, optical sensing areas, and fingerprint sensing blocks of a sensing panel.

Referring to FIGS. 13A to 13C, the optical sensing area OSA may be defined in the sensing base layer SBL and the sensing layer SL by the transmission pin holes PH. The optical area SA (refer to FIG. 7) of the sensing panel SP may include a fingerprint sensing area FSA where the fingerprint may be sensed and a non-fingerprint-sensing area NFSA defined adjacent to the fingerprint sensing area FSA. The non-optical-sensing area NOSA (refer to FIG. 13B) may overlap the non-fingerprint-sensing area NFSA. One optical sensing area OSA may overlap the plural fingerprint sensing pixels FSX of the fingerprint sensing area FSA. In the following descriptions, the fingerprint sensing pixels FSX overlapping the optical sensing area OSA will be referred to as a "fingerprint sensing block" FSB, which may be also referred to as a region of the sensing base layer SBL. The fingerprint sensing block FSB may have an area equal to or greater than that of the optical sensing area OSA. For example, each of the fingerprint sensing blocks FSB may include four fingerprint sensing pixels FSX arranged in the first direction DR1 and four fingerprint sensing pixels FSX arranged in the second direction DR2. As described with reference to FIGS. 13A and 13B, the number of the fingerprint sensing pixels included in the one fingerprint sensing block may be determined depending on the size of the optical sensing area OSA, which is determined according to the distance OD between the window member WM and the optical layer OCL, the distance ID between the optical layer OCL and the sensing panel SP, the thickness T of the optical layer OCL, the diameter DI of the pin hole PH, and the shape of the pin hole PH. Meanwhile, the size and the shape of the fingerprint sensing block FSB and the number of the fingerprint sensing pixels included in the fingerprint sensing block FSB are merely exemplary and may be changed in various ways. The sensing base layer SBL may include the optical sensing areas OSA1 and OSA2. The optical sensing areas OSA1 and OSA2 may be defined based on the viewing angle of a corresponding one of the transmission pin holes PH1 and PH2. A first region of the sensing base layer SBL may correspond to a corresponding one of the optical sensing areas OSA1 and OSA2. The first region of the sensing base layer SBL may have an area equal to or greater than a corresponding one of the optical sensing areas OSA1 and OSA2.

Accordingly, the sensing panel SP may be divided into the fingerprint sensing area FSA in which the fingerprint sensing pixels FSX are arranged and the non-fingerprint-sensing area NFSA in which the fingerprint sensing pixels FSX are not arranged.

Figure 14A:
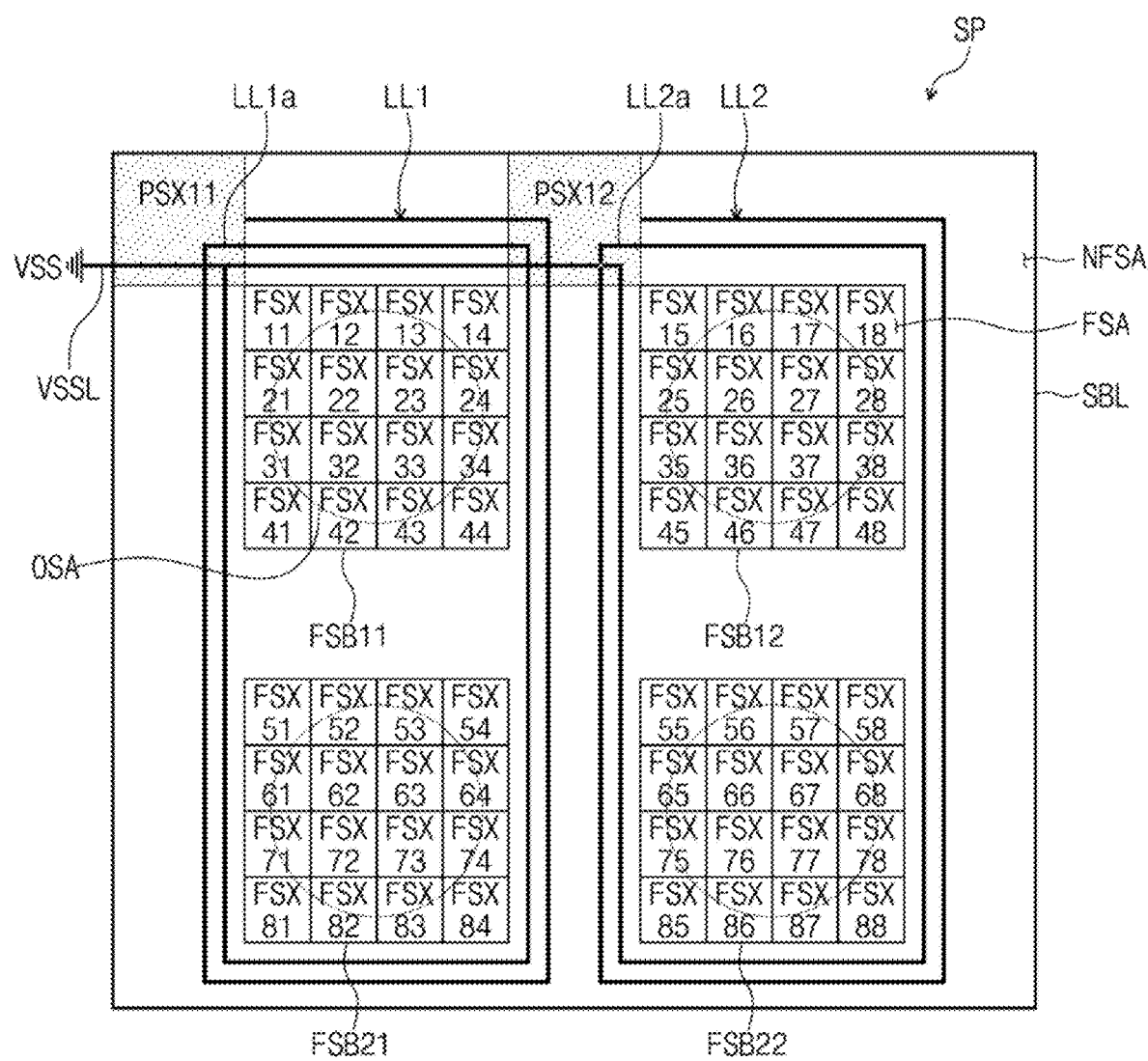
FIG. 14A is a plan view showing fingerprint sensing pixels and pen sensing pixels arranged in the sensing panel.

FIG. 14A is a plan view showing fingerprint sensing pixels and pen sensing pixels arranged in the sensing panel.

Figure 14B:
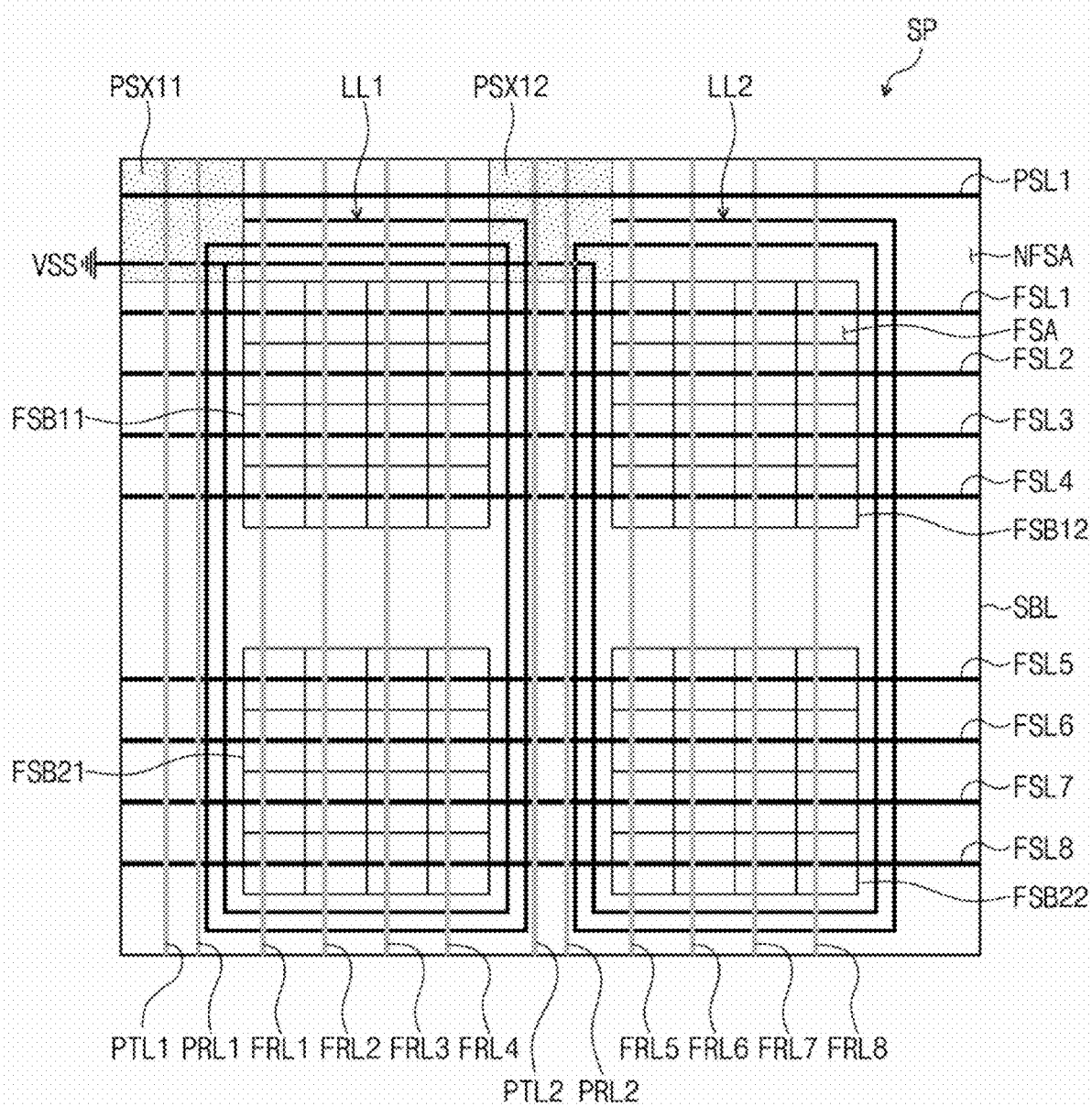
FIG. 14B is a plan view showing fingerprint scan lines, fingerprint receiving lines, pen scan lines, pen transmission lines, and pen receiving lines, which are electrically connected to the fingerprint sensing pixels and the pen sensing pixels arranged in the sensing panel.

FIG. 14B is a plan view showing the fingerprint scan lines, the fingerprint receiving lines, the pen scan lines, the pen transmission lines, and the pen receiving lines, which are electrically connected to the fingerprint sensing pixels and the pen sensing pixels arranged in the sensing panel. Referring to FIGS. 14A and 14B, fingerprint sensing pixels FSX11 to FSX88 may be arranged in the fingerprint sensing area FSA. A fingerprint sensing block FSB11 may include sixteen fingerprint sensing pixels FSX11 to FSX14, FSX21 to FSX24, FSX31 to FSX34, and FSX11 to FSX44, a fingerprint sensing block FSB12 may include sixteen fingerprint sensing pixels FSX15 to FSX18, FSX25 to FSX28, FSX35 to FSX38 and FSX45 to FSX48, a fingerprint sensing block FSB21 may include sixteen fingerprint sensing pixels FSX51 to FSX54, FSX61 to FSX64, FSX71 to FSX74 and FSX81 to FSX84, and a fingerprint sensing block FSB22 may include sixteen fingerprint sensing pixels FSX55 to FSX58, FSX65 to FSX68, FSX75 to FSX78 and FSX85 to FSX88. As described above, the size and the shape of the fingerprint sensing blocks FSB11 to FSB22 shown in FIGS. 14A and 14B and the number of the fingerprint sensing pixels included in the fingerprint sensing blocks FSB11 to FSB22 are merely exemplary and may be changed in various ways.

The pen sensing pixels PSX11 and PSX12 may be disposed in the non-fingerprint-sensing area NFSA. In the exemplary embodiment shown in FIGS. 14A and 14B, the pen sensing pixel PSX11 may be disposed in the non-fingerprint-sensing area NFSA adjacent to an upper left corner of a corresponding fingerprint sensing pixel FSX11 among the fingerprint sensing pixels FSX11 to FSX88 in a first diagonal direction, and the pen sensing pixel PSX12 may be disposed in the non-fingerprint-sensing area NFSA adjacent to an upper left corner of a corresponding fingerprint sensing pixel FSX15 among the fingerprint sensing pixels FSX11 to FSX88 in the first diagonal direction and adjacent to an upper right corner of a corresponding fingerprint sensing pixel FSX14 among the fingerprint sensing pixels FAX11 to FSX44 in a second diagonal direction different from the first diagonal direction. However, this is merely exemplary, and each of the pen sensing pixels PSX11 and PSX12 may be disposed at an arbitrary position in the non-fingerprint-sensing area NFSA adjacent to a corresponding fingerprint sensing pixel among the fingerprint sensing pixels FSX11 to FSX88.

In addition, the first switching transistor PST1 and the second switching transistor PST2 of FIG. 10 may be disposed in each of the pen sensing pixels PSX11 and PSX12. Each of sensing coils LL1 and LL2 of FIG. 10 may be disposed in the non-fingerprint-sensing area NFSA around at least one fingerprint sensing block among the fingerprint sensing blocks FSB11 to FSB22. For example, the pen sensing pixel PSX11 and the sensing coil LL1 connected thereto may correspond to the pen sensing pixel PSXab shown in FIG. 10, and the pen sensing pixel PSX12 and the sensing coil LL2 connected thereto may correspond to the pen sensing pixel PSXab shown in FIG. 10.

The sensing coil LL1 may be disposed in a spiral shape surrounding the fingerprint sensing blocks FSB11 and FSB21 in the non-fingerprint-sensing area NFSA around the fingerprint sensing blocks FSB11 and FSB21. One end of the sensing coil LL1 may be electrically connected to the pen sensing pixel PSX11, and the other end of the sensing coil LL1 may be connected to the ground voltage terminal VSS. The sensing coil LL2 may be disposed in a spiral shape surrounding the fingerprint sensing blocks FSB12 and FSB22 in the non-fingerprint-sensing area NFSA around the fingerprint sensing blocks FSB12 and FSB22. One end of the sensing coil LL2 may be electrically connected to the pen sensing pixel PSX12, and the other end of the sensing coil LL2 may be connected to the ground voltage terminal VSS. In an example embodiment, a portion of the sensing coil LL1 may be directly adjacent to a fingerprint sensing pixel FSX11 of the fingerprint sensing block FSB11. In an example embodiment, a portion of the sensing coil LL2 may be directly adjacent to a fingerprint sensing pixel FSX15 of the fingerprint sensing block FSB12.

In the exemplary embodiment, each of the sensing coils LL1 and LL2 may have a line width of about 480 and a distance between lines may be about 480 µm. In addition, a line VSSL connected between the ground voltage terminal VSS and the sensing coil LL1 and the sensing coil LL2 may be disposed on a layer different from a layer on which spiral lines LL1a and LL2a are disposed and may be insulated from the spiral lines LL1a and LL2a.

As described above, as the pen sensing pixels PSX11 and PSX12 and the fingerprint sensing pixels FSX11 to FSX88 are disposed in the sensing panel SP, the fingerprint by the first touch TC1 (refer to FIG. 1) and the pen input due to the second touch TC2 (refer to FIG. 1) may be sensed. Further, since the pen sensing pixels PSX11 and PSX12 and the sensing coils LL1 and LL2 are disposed in the non-fingerprint-sensing area NFSA, a resolution of the fingerprint sensing pixels FSX11 to FSX88 is not reduced due to the presence of the pen sensing pixels PSX11 and PSX12.

As shown in FIG. 14B, the pen scan lines PSL1 and PSL2, the pen transmission lines PTL1 and PTL2, and the pen receiving lines PRL1 and PRL2 may be disposed adjacent to the pen sensing pixels PSX11 and PSX12. The fingerprint scan lines FSL1 to FSL8 and the fingerprint receiving lines FRL1 to FRL8 may be disposed adjacent to the fingerprint sensing pixels FSX11 to FSX88.

The pen scan lines PSL1 and PSL2, the pen transmission lines PTL1 and PTL2, and the pen receiving lines PRL1 and PRL2, the fingerprint scan lines FSL1 to FSL8, and the fingerprint receiving lines FRL1 to FRL8 may be insulated from each other and may be insulated from the sensing coils LL1 and LL2.

FIGS. 15, 16A, 16B, 17A, 17B, 18A, 18B, 20A, and 20B are circuit diagrams showing a pen sensing pixel according to an exemplary embodiment of the present disclosure.

In FIGS. 15, 16A, 16B, 17A, 17B, 18A, 18B, 20A, and 20B, the same reference numerals denote the same elements of the pen sensing pixel PSXab shown in FIG. 10, and thus detailed descriptions of the same elements will be omitted.

Figure 15:
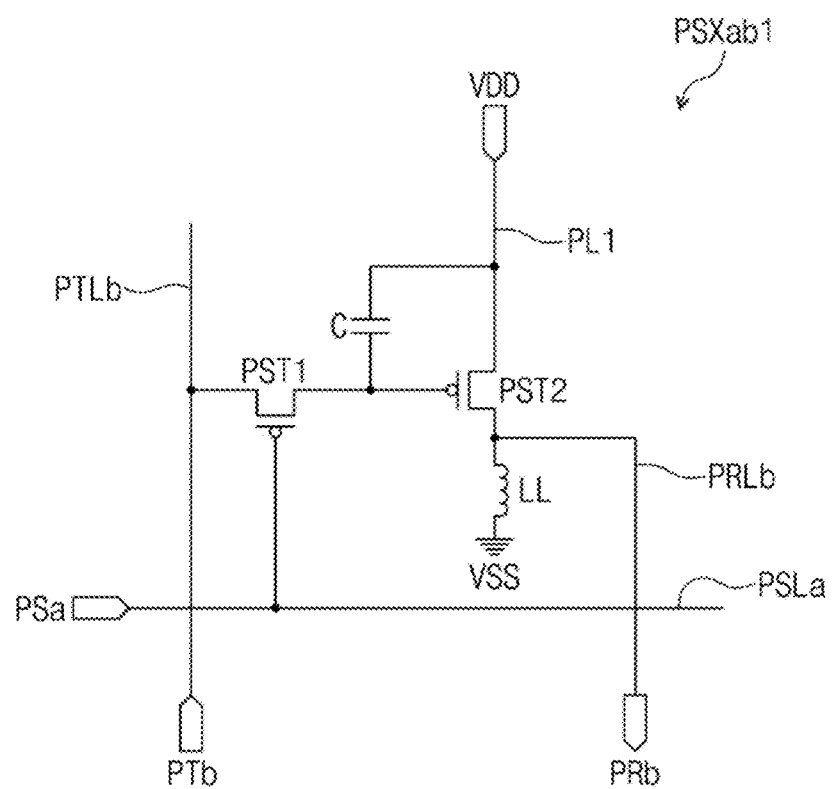
FIGS. 15, 16A, 16B, 17A, 17B, 18A and 18B are circuit diagrams showing a pen sensing pixel according to another exemplary embodiment of the present disclosure.

Referring to FIG. 15, a pen sensing pixel PSXab1 may include a first switching transistor PST1, a second switching transistor PST2, a capacitor C, and a sensing coil LL. Different from the pen sensing pixel PSXab shown in FIG. 10, the pen sensing pixel PSXab1 shown in FIG. 15 may further include the capacitor C. One end of the capacitor C may be connected to a first power line PL1 receiving a power supply voltage VDD, and the other end of the capacitor C may be connected to a gate electrode of the second switching transistor PST2.

In the exemplary embodiment, each of the first switching transistor PST1 and the second switching transistor PST2 may be a PMOS transistor, however, it should not be limited thereto or thereby. In an example embodiment, each of the first switching transistor PST1 and the second switching transistor PST2 may be an NMOS transistor.

Figure 16A:
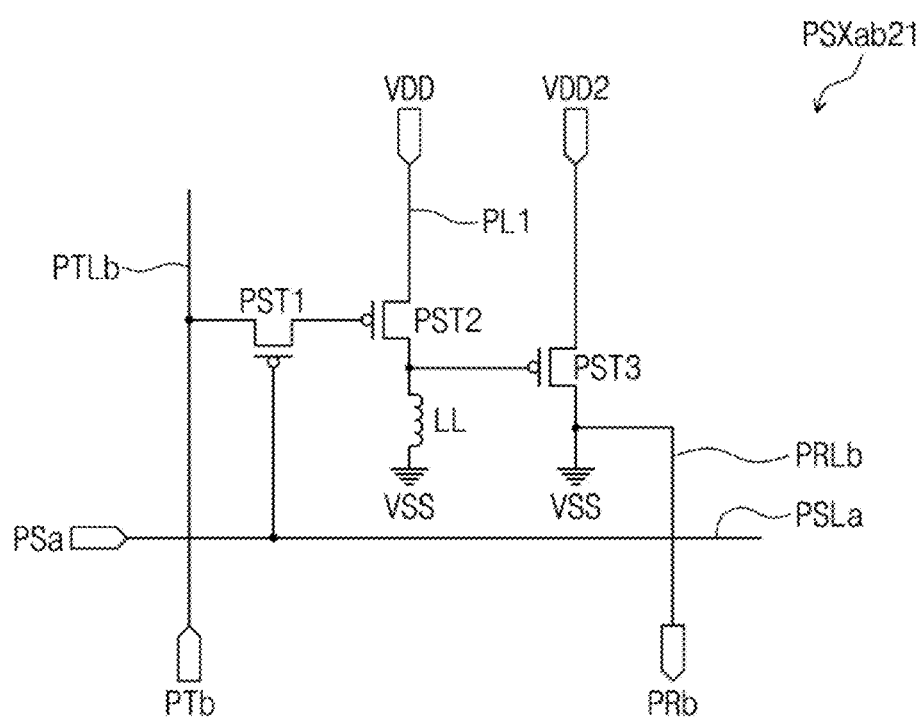

Referring to FIG. 16A, a pen sensing pixel PSXab21 may include a first switching transistor PST1, a second switching transistor PST2, a third switching transistor PST3, and a sensing coil LL. The pen sensing pixel PSXab21 shown in FIG. 16A may further include the third switching transistor PST3 compared with the pen sensing pixel PSXab shown in FIG. 10. The third switching transistor PST3 may include a first electrode receiving a second power supply voltage VDD2, a second electrode connected to a ground voltage terminal VSS, and a gate electrode connected to a second electrode of the second switching transistor PST2. The second electrode of the third switching transistor PST3 may be also connected to a pen receiving line PRLb. The third switching transistor PST3 may be turned on or off in response to a signal from one end of the sensing coil LL. The one end of the sensing coil LL may be connected to the second electrode of the second switching transistor PST2, and the other end of the sensing coil LL may be connected to the ground voltage terminal VSS. In the exemplary embodiment, the power supply voltage VDD and the second power supply voltage VDD2 are described to be different from each other, however, they should not be limited thereto or thereby. The power supply voltage VDD and the second power supply voltage VDD2 may have substantially the same voltage level.

Figure 16B:
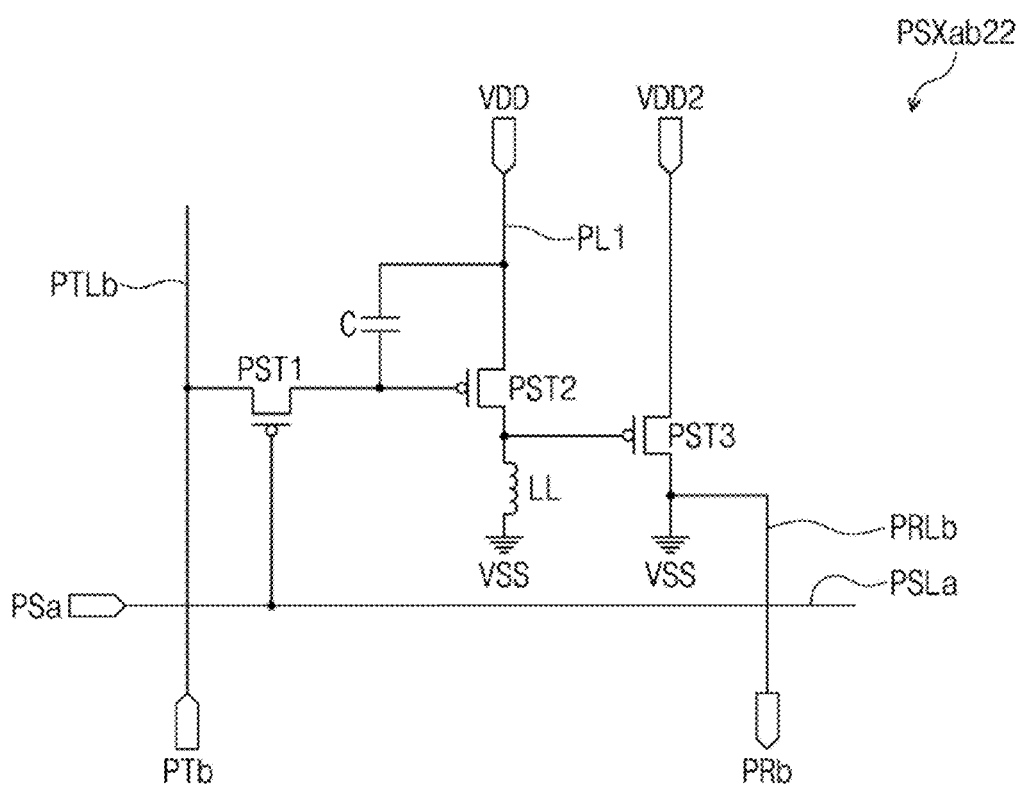

Referring to FIG. 16B, a pen sensing pixel PSXab22 may include a first switching transistor PST1, a second switching transistor PST2, a third switching transistor PST3, a capacitor C, and a sensing coil LL. Different from the pen sensing pixel PSXab21 shown in FIG. 16A, the pen sensing pixel PSXab22 shown in FIG. 16B may further include the capacitor C. One end of the capacitor C may be connected to a first power line PL1 receiving a power supply voltage VDD, and the other end of the capacitor C may be connected to a gate electrode of the second switching transistor PST2.

Figure 17A:
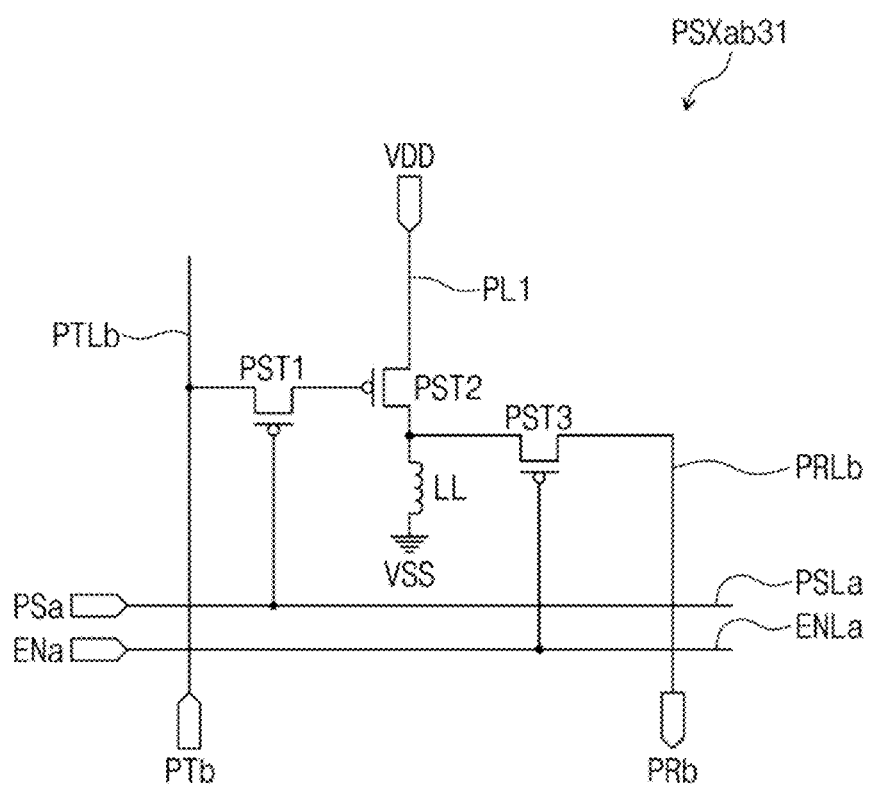

Referring to FIG. 17A, a pen sensing pixel PSXab31 may include a first switching transistor PST1, a second switching transistor PST2, a third switching transistor PST3, and a sensing coil LL. The pen sensing pixel PSXab31 shown in FIG. 17A may further include the third switching transistor PST3 compared with the pen sensing pixel PSXab shown in FIG. 10. One end of the sensing coil LL may be connected to a second electrode of the second switching transistor PST2, and the other end of the sensing coil LL may be connected to a ground voltage terminal VSS. The third switching transistor PST3 may include a first electrode connected to the one end of the sensing coil LL, a second electrode connected to a pen receiving line PRLb, and a gate electrode connected to an enable signal line ENLa. The third switching transistor PST3 may be turned on or off in response to an enable signal ENa applied thereto via the enable signal line ENLa.

Figure 17B:
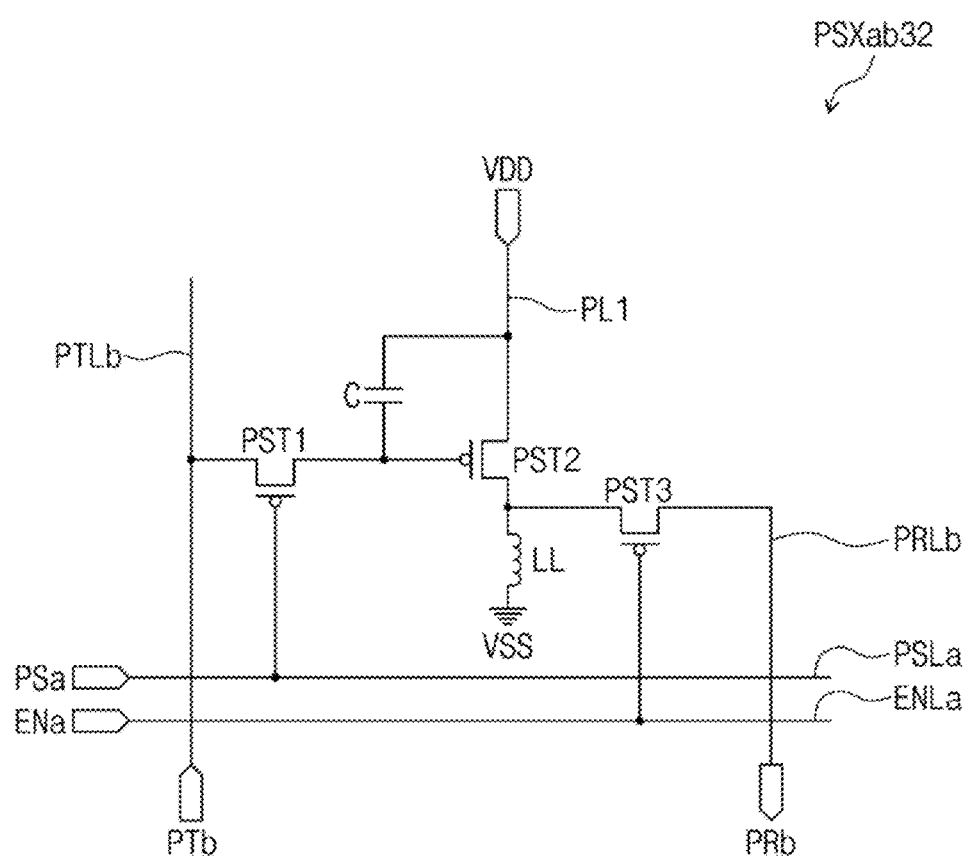

Referring to FIG. 17B, a pen sensing pixel PSXab32 may include a first switching transistor PST1, a second switching transistor PST2, a third switching transistor PST3, a capacitor C, and a sensing coil LL. Different from the pen sensing pixel PSXab31 shown in FIG. 17A, the pen sensing pixel PSXab32 shown in FIG. 17B may further include the capacitor C. One end of the capacitor C may be connected to a first power line PL1 receiving a power supply voltage VDD, and the other end of the capacitor C may be connected to a gate electrode of the second switching transistor PST2.

Figure 19:
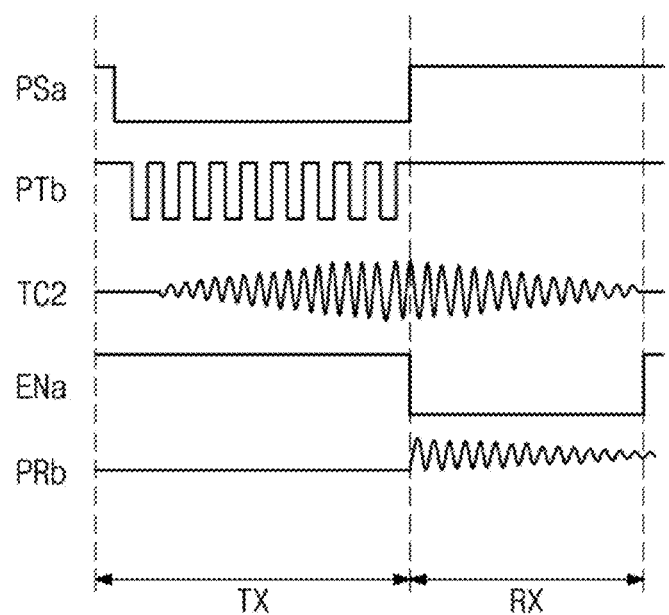
FIG. 19 is a timing diagram showing an operation of the pen sensing pixel shown in FIG. 17A.

FIG. 19 is a timing diagram showing an operation of the pen sensing pixel PSXab31 shown in FIG. 17A.

Referring to FIGS. 17A and 18, when a pen scan signal PSa having an active level, for example, a low level, is applied to a pen scan line PSLa during a transmission period TX, the first switching transistor PST1 may be turned on. For example, when a predetermined pen transmission signal PTb is applied to a pen transmission line PTLb, the second switching transistor PST2 may be repeatedly turned on and off by the pen transmission signal PTb, and thus, a current may flow through the sensing coil LL, thereby forming a magnetic field. A magnitude of a resonance signal sensed at the one end of the sensing coil LL may be changed depending on presence or absence of the second input TC2. When the third switching transistor PST3 is turned on in response to the enable signal ENa having the active level, for example, the low level, during the transmission period TX, the pen sensing circuit PSC (refer to FIG. 8) may receive the resonance signal at the one end of the sensing coil LL via the pen receiving line PRLb as a pen receiving signal PRb. Since the pen sensing circuit PSC (refer to FIG. 8) receives the pen receiving signal PRb only when the third switching transistor PST3 is turned on in response to the enable signal ENa, influences caused by noises may be minimized.

Figure 18A:
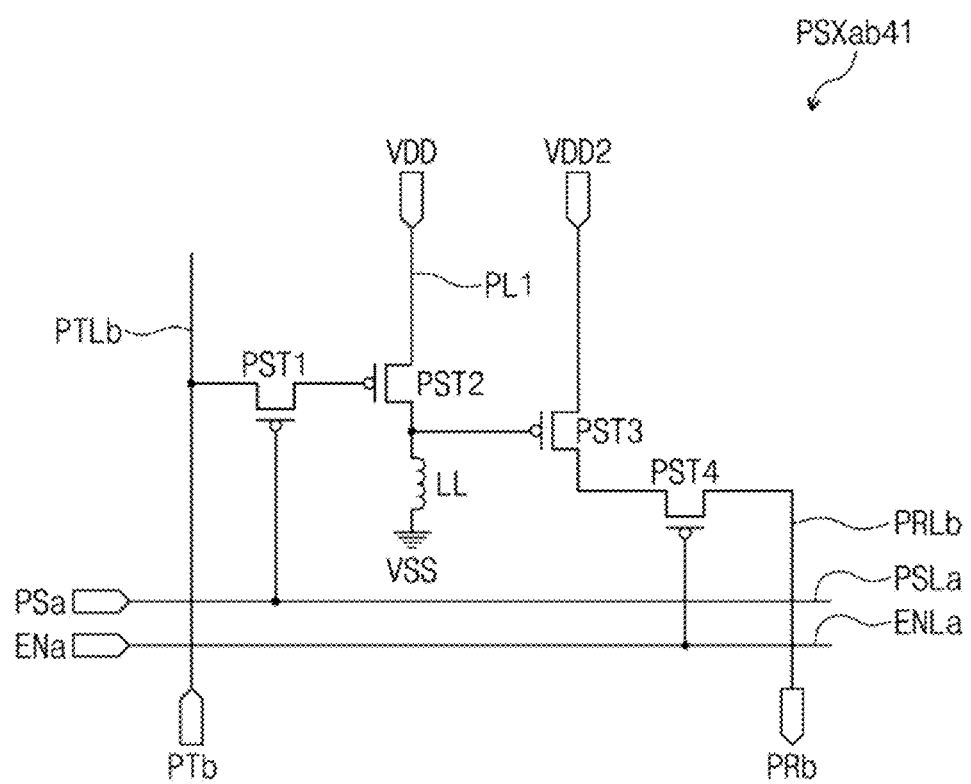

Referring to FIG. 18A, a pen sensing pixel PSXab41 may include a first switching transistor PST1, a second switching transistor PST2, a third switching transistor PST3, a fourth switching transistor PST4, and a sensing coil LL. The pen sensing pixel PSXab41 shown in FIG. 18A may further include the third switching transistor PST3 and the fourth switching transistor PST4 compared with the pen sensing pixel PSXab shown in FIG. 10. One end of the sensing coil LL may be connected to a second electrode of the second switching transistor PST2, and the other end of the sensing coil LL may be connected to a ground voltage terminal VSS. The third switching transistor PST3 may include a first electrode receiving a second power supply voltage VDD2, a second electrode, and a gate electrode connected to the one end of the sensing coil LL. The fourth switching transistor PST4 may include a first electrode connected to the second electrode of the third switching transistor PST3, a second electrode connected to a pen receiving line PRLb, and a gate electrode connected to an enable signal line ENLa. The third switching transistor PST3 may be turned on or off in response to a resonance signal at the one end of the sensing coil LL. The fourth switching transistor PST4 may be turned on or off in response to an enable signal ENa applied thereto via the enable signal line ENLa.

Figure 18B:
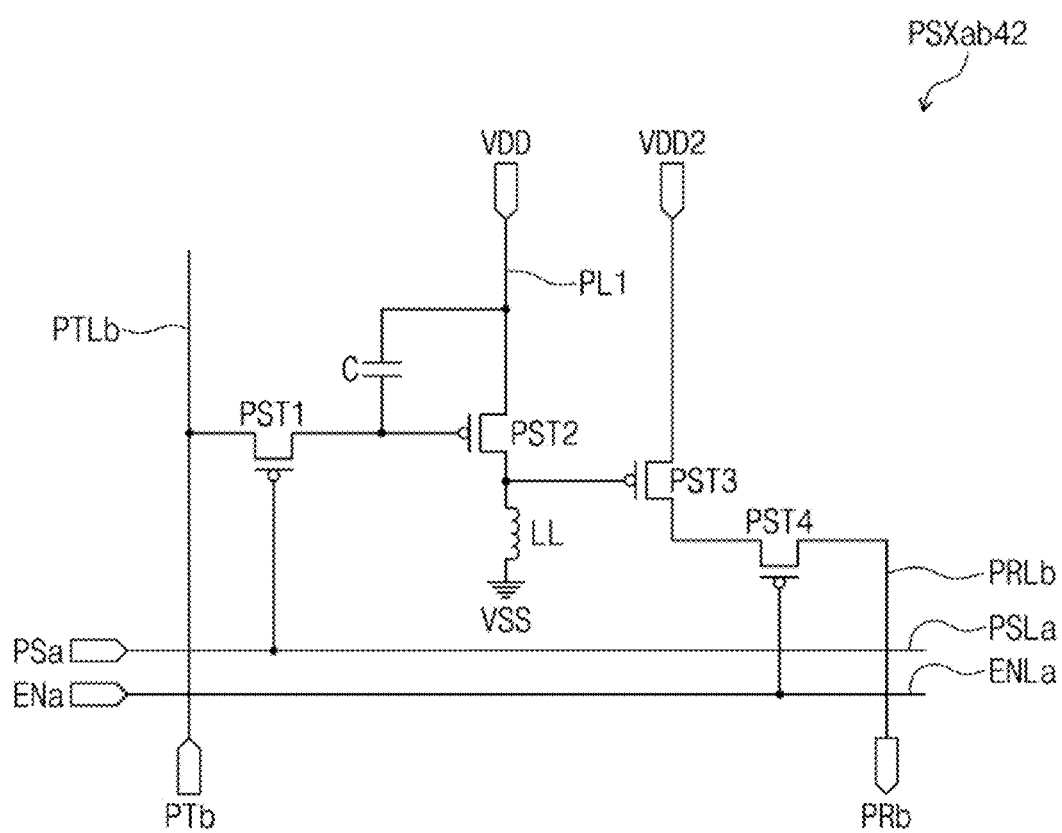

Referring to FIG. 18B, a pen sensing pixel PSXab42 may include a first switching transistor PST1, a second switching transistor PST2, a third switching transistor PST3, a fourth switching transistor PST4, a capacitor C, and a sensing coil LL. Different from the pen sensing pixel PSXab41 shown in FIG. 18A, the pen sensing pixel PSXab42 shown in FIG. 18B may further include the capacitor C. One end of the capacitor C may be connected to a first power line PL1 receiving a power supply voltage VDD, and the other end of the capacitor C may be connected to a gate electrode of the second switching transistor PST2.

Figure 20A:
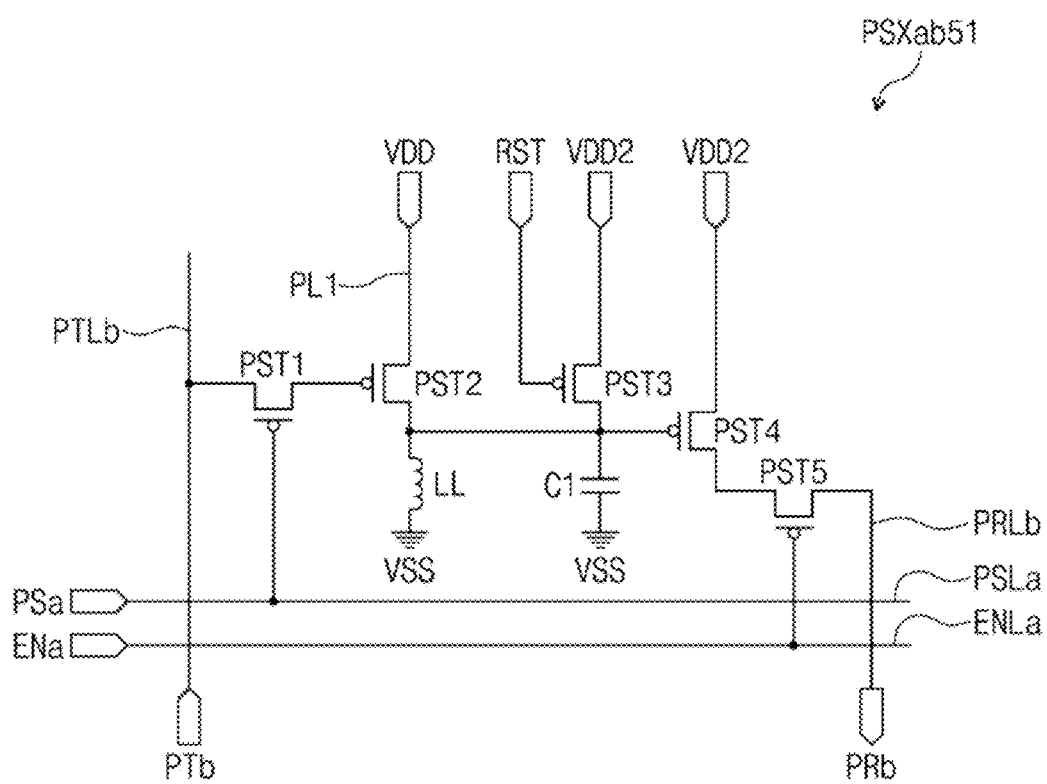
FIGS. 20A, and 20B are circuit diagrams showing a pen sensing pixel according to another exemplary embodiment of the present disclosure.

Referring to FIG. 20A, a pen sensing pixel PSXab51 may include a first switching transistor PST1, a second switching transistor PST2, a third switching transistor PST3, a fourth switching transistor PST4, a fifth switching transistor PST5, a first capacitor C1, and a sensing coil LL. The pen sensing pixel PSXab51 shown in FIG. 20A may further include the third, fourth, and fifth switching transistors PST3, PST4, and PST5 and the first capacitor C1 compared with the pen sensing pixel PSXab shown in FIG. 10. One end of the sensing coil LL may be connected to a second electrode of the second switching transistor PST2, and the other end of the sensing coil LL may be connected to a ground voltage terminal VSS. The third switching transistor PST3 may include a first electrode receiving a second power supply voltage VDD2, a second electrode connected to the one end of the sensing coil LL, and a gate electrode receiving a reset signal RST. The fourth switching transistor PST4 may include a first electrode receiving the second power supply voltage VDD2, a second electrode, and a gate electrode connected to the one end of the sensing coil LL. The fifth switching transistor PST5 may include a first electrode connected to the second electrode of the fourth switching transistor PST4, a second electrode connected to a pen receiving line PRLb, and a gate electrode connected to an enable signal line ENLa. The first capacitor C1 may be connected between the one end of the sensing coil LL and the ground voltage terminal VSS.

The third switching transistor PST3 may be turned on or off in response to a reset signal RST. The fourth switching transistor PST may be turned on or off in response to a resonance signal at the one end of the sensing coil LL. The fifth switching transistor PST5 may be turned on or off in response to an enable signal ENa applied thereto via the enable signal line ENLa.

Figure 20B:
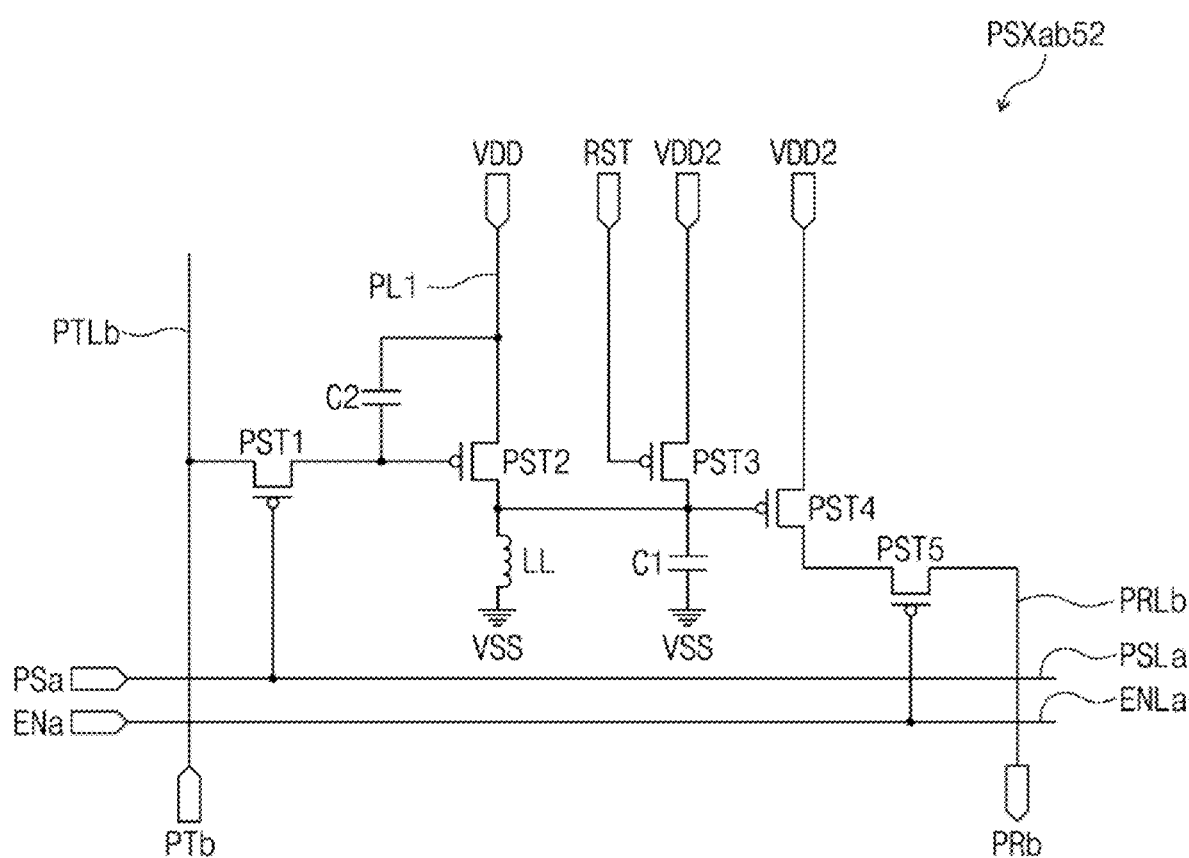

Referring to FIG. 20B, a pen sensing pixel PSXab52 may include a first switching transistor PST1, a second switching transistor PST2, a third switching transistor PST3, a fourth switching transistor PST4, a fifth switching transistor PST5, a first capacitor C1, a second capacitor C2, and a sensing coil LL. Different from the pen sensing pixel PSXab51 shown in FIG. 20A, the pen sensing pixel PSXab52 shown in FIG. 20B may further include the second capacitor C2. One end of the capacitor C2 may be connected to a first power line PL1 receiving a power supply voltage VDD, and the other end of the capacitor C2 may be connected to a gate electrode of the second switching transistor PST2.

Figure 21:
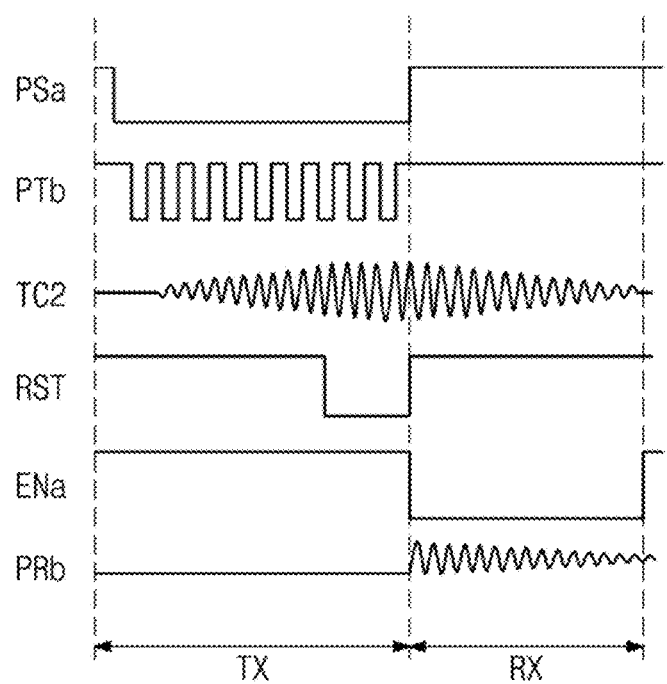
FIG. 21 is a timing diagram showing an operation of the pen sensing pixel shown in FIG. 20A.

Referring to FIGS. 20A and 21, when a pen scan signal PSa having an active level, for example, a low level, is applied to a pen scan line PSLa during a transmission period TX, the first switching transistor PST1 may be turned on. For example, when a predetermined pen transmission signal PTb is applied to a pen transmission line PTLb, the second switching transistor PST2 may be repeatedly turned on and off by the pen transmission signal PTb, and thus, a current may flow through the sensing coil LL, thereby forming a magnetic field. A magnitude of the resonance signal sensed at the one end of the sensing coil LL may be changed depending on presence or absence of the second input TC2. The fourth switching transistor PST4 may be repeatedly turned on and off during a reception period RX according to a level of the resonance signal. When the fifth switching transistor PST5 is turned on in response to the enable signal ENa having the active level, for example, the low level, the pen sensing circuit PSC (refer to FIG. 8) may receive the resonance signal at the one end of the sensing coil LL via the pen receiving line PRLb as a pen receiving signal PRb.

The reset signal RST may change to the active level, e.g., the low level, at a later portion of the transmission period TX before the reception period RX starts. The third switching transistor PST3 of the pen sensing pixel PSXab51 may apply the second power supply voltage VDD2 to the one end of the sensing coil LL in response to the reset signal RST, and thus, the resonance signal at the one end of the sensing coil LL may be reset. In addition, since the pen sensing circuit PSC (refer to FIG. 8) receives the pen receiving signal PRb only when the third switching transistor PST3 is turned on in response to the enable signal ENa, influences caused by noises may be minimized.

In the exemplary embodiments shown in FIGS. 15, 16A, 16B, 17A, 17B, 18A, 18B, 20A, and 20B, each of the first to fifth switching transistors PST1 to PST5 may be a PMOS transistor, however, it should not be limited thereto or thereby. According to another embodiment, each of the first to fifth switching transistors PST1 to PST5 may be an NMOS transistor.

Figure 22:
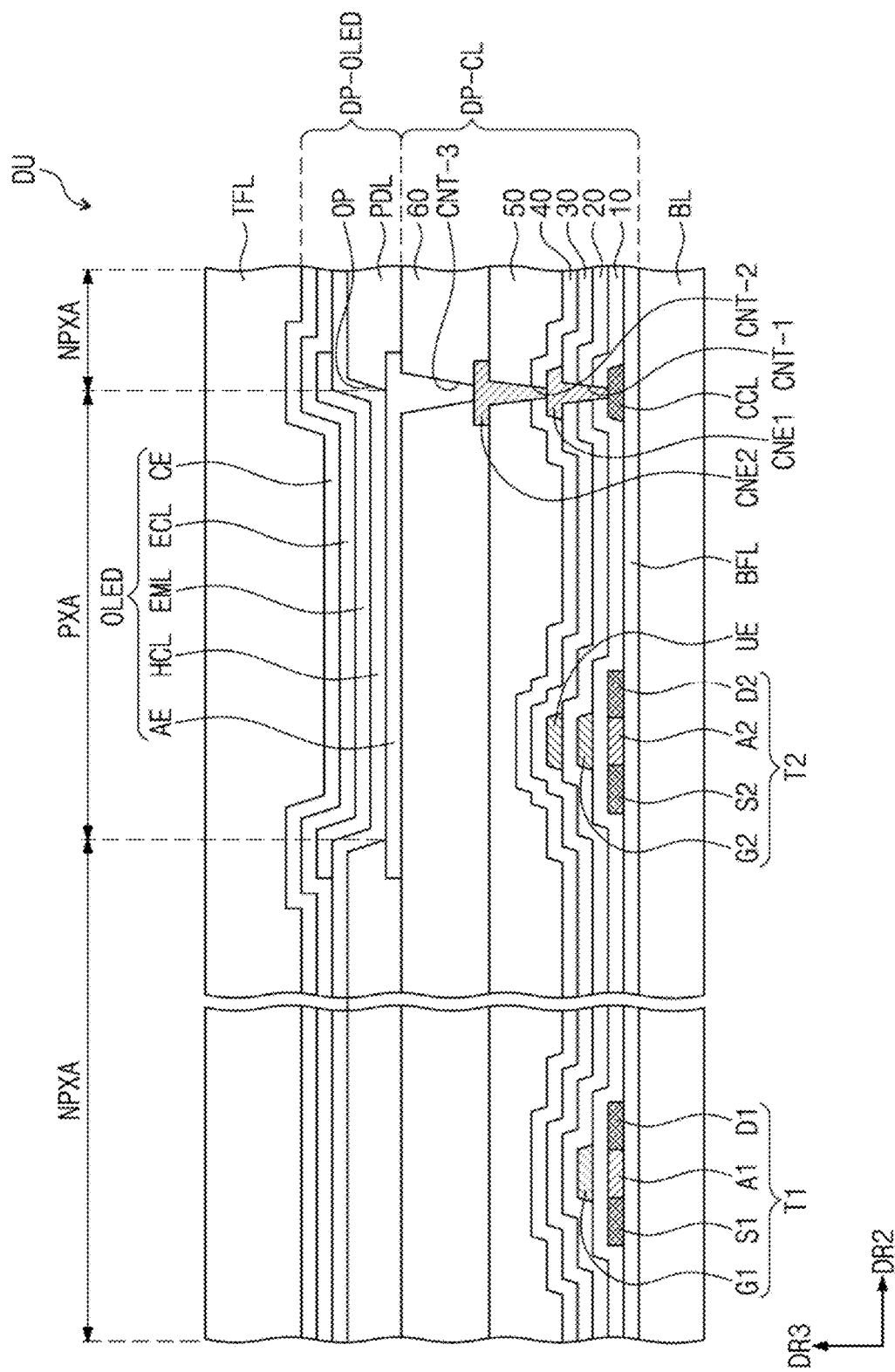
FIG. 22 is an enlarged cross-sectional view showing a display unit according to an exemplary embodiment of the present disclosure.

FIG. 22 is an enlarged cross-sectional view showing a display unit DU according to an exemplary embodiment of the present disclosure.

Referring to FIG. 22, the display unit DU may include a base layer BL, a circuit element layer DP-CL, a display element layer DP-OLED, and an upper insulating layer TFL. The display unit DU may include a plurality of insulating layers, a semiconductor pattern, a conductive pattern, and a signal line. The insulating layers, a semiconductor layer, and a conductive layer may be formed by a coating or depositing process. Then, the insulating layers, the semiconductor layer, and the conductive layer may be selectively patterned by a photolithography process. The semiconductor pattern, the conductive pattern, and the signal line, which are included in the circuit element layer DP-CL and the display element layer DP-OLED may be formed by the above-mentioned process.

The base layer BL may include a synthetic resin film. The synthetic resin film may include a heat curable resin. The base layer BL may have a multi-layer structure. For example, the base layer BL may have a three-layer structure of a synthetic resin layer, an adhesive layer, and a synthetic resin layer. In an example embodiment, the synthetic resin layer may be a polyimide-based resin layer, however, it should not be particularly limited. The synthetic resin layer may include at least one of an acrylic-based resin, a methacrylic-based resin, polyisoprene, a vinyl-based resin, an epoxy-based resin, a urethane-based resin, a cellulose-based resin, a siloxane-based resin, a polyamide-based resin, and a perylene-based resin. In addition, the base layer BL may include a glass substrate, a metal substrate, or an organic/inorganic composite substrate.

At least one inorganic layer may be formed on an upper surface of the base layer BL. The inorganic layer may include at least one of aluminum oxide, titanium oxide, silicon oxide, silicon oxynitride, zirconium oxide, and a hafnium oxide. The inorganic layer may have a multi-layer structure of layers. The inorganic layers may form a barrier layer and/or a buffer layer. In the present exemplary embodiment, the display unit DU is shown as including a buffer layer BFL.

The buffer layer BFL may increase an adhesive force between the base layer BL and the semiconductor pattern. The buffer layer BFL may include a silicon oxide layer and a silicon nitride layer. The silicon oxide layer and the silicon nitride layer may be alternately stacked one on another.

The semiconductor pattern may be disposed on the buffer layer BFL. The semiconductor pattern may include polysilicon, however, it should not be limited thereto or thereby. The semiconductor pattern may include amorphous silicon or metal oxide.

FIG. 22 shows a portion of the semiconductor pattern, and the semiconductor pattern may be further disposed in another area of the pixel PX in a plan view. The semiconductor pattern may be arranged with a specific pattern over pixels PX. The semiconductor pattern may have an electrical property varying depending on a presence or absence of a dopant. The semiconductor pattern may include a doped area and an un-doped area. The doped area may be doped with an N-type dopant or a P-type dopant. A P-type transistor may include a doped area doped with the P-type dopant.

The doped area may have a conductivity greater than that of the un-doped area and may substantially serve as an electrode or a signal line. The un-doped area may substantially correspond to an active region (or channel) of a transistor. For example, a portion of the semiconductor pattern may serve as the active region (or channel) of the transistor, another portion of the semiconductor pattern may serve as a source or a drain of the transistor, and the other portion of the semiconductor pattern may serve as a connection electrode or a connection signal line.

As shown in FIG. 22, a source S1, an active region A1, and a drain D1 of a first transistor T1 may be formed from the semiconductor pattern, and a source S2, an active region A2, and a drain D2 of a second transistor T2 may be formed from the semiconductor pattern. The source S1 and the drain D1 may extend from the active region A1 in opposite directions to each other in a cross-section, and the source S2 and the drain D2 may extend from the active region A2 in opposite directions to each other in the cross-section. FIG. 22 shows a portion of a connection signal line CCL formed from the semiconductor pattern. Although not shown separately, the connection signal line CCL may be connected to the drain D2 of the second transistor T2 in a plan view.

A first insulating layer 10 may be disposed on the buffer layer BFL. The first insulating layer 10 may commonly overlap the pixels PX (refer to FIG. 5) and may cover the semiconductor pattern. The first insulating layer 10 may include an inorganic layer and/or an organic layer and may have a single-layer or multi-layer structure. The first insulating layer 10 may include at least one of aluminum oxide, titanium oxide, silicon oxide, silicon oxynitride, zirconium oxide, and a hafnium oxide. In the present exemplary embodiment, the first insulating layer 10 may have the single silicon oxide layer. An insulating layer of the circuit element layer DP-CL described later may include an inorganic layer and/or an organic layer and may have a single-layer or multi-layer structure as the first insulating layer 10. The inorganic layer may include at least one of the above-mentioned materials.

Gates G1 and G2 may be disposed on the first insulating layer 10. The gates G1 and G2 may be portions of the metal pattern. The gates G1 and G2 may overlap the active regions A1 and A2, respectively. The gates G1 and G2 may serve as a mask in a process of doping the semiconductor pattern.

A second insulating layer 20 may be disposed on the first insulating layer 10 to cover the gates G1 and G2. The second insulating layer 20 may commonly overlap the pixels PX (refer to FIG. 5). The second insulating layer 20 may include an inorganic layer and/or an organic layer and may have a single-layer or multi-layer structure. In the present exemplary embodiment, the second insulating layer 20 may include the single silicon oxide layer.

An upper electrode UE may be disposed on the second insulating layer 20. The upper electrode UE may overlap the gate G2 of the second transistor T2. The upper electrode UE may be a portion of the metal pattern. A portion of the gate G2 and the upper electrode UE overlapping the portion of the gate G2 may form the capacitor CP (refer to FIG. 5). The upper electrode UE may be omitted in the exemplary embodiment of the present disclosure.

A third insulating layer 30 may be disposed on the second insulating layer 20 to cover the upper electrode UE. In the present exemplary embodiment, the third insulating layer 30 may include a single silicon oxide layer. A first connection electrode CNE1 may be disposed on the third insulating layer 30. The first connection electrode CNE1 may be connected to the connection signal line CCL through a contact hole CNT-1 defined through the first to third insulating layers 10 to 30.

A fourth insulating layer 40 may be disposed on the third insulating layer 30 to cover the first connection electrode CNE1. The fourth insulating layer 40 may include a single silicon oxide layer. A fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a second contact hole CNT-2 defined through the fourth insulating layer 40 and the fifth insulating layer 50.

A sixth insulating layer 60 may be disposed on the fifth insulating layer 50 to cover the second connection electrode CNE2. The sixth insulating layer 60 may be an organic layer. A first electrode AE may be disposed on the sixth insulating layer 60. The first electrode AE may be connected to the second connection electrode CNE2 through a contact hole CNT-3 defined through the sixth insulating layer 60. An opening OP is defined through a pixel definition layer PDL. At least a portion of the first electrode AE may be exposed through the opening OP of the pixel definition layer PDL.

As shown in FIG. 22, the display area DU-DA (refer to FIG. 5) may include a light emitting area PXA and a non-light-emitting area NPXA defined adjacent to the light emitting area PXA. The non-light-emitting area NPXA may surround the light emitting area PXA. In the present exemplary embodiment, the light emitting area PXA may be defined to correspond to a portion of the first electrode AE exposed through the opening OP.

A hole control layer HCL may be commonly disposed in the light emitting area PXA and the non-light-emitting area NPXA. The hole control layer HCL may include a hole transport layer and may further include a hole injection layer. A light emitting layer EML may be disposed on the hole control layer HCL. The light emitting layer EML may be disposed in an area corresponding to the opening OP. For example, the light emitting layer EML may be respectively formed in the pixels after being divided into plural portions.

An electron control layer ECL may be disposed on the light emitting layer EML. The electron control layer ECL may include an electron transport layer and may further include an electron injection layer. The hole control layer HCL and the electron control layer ECL may be commonly formed in the pixels using an open mask. A second electrode CE may be disposed on the electron control layer ECL. The second electrode CE may have a single body and may be commonly disposed over the pixels PX (refer to FIG. 5).

As shown in FIG. 22, the upper insulating layer TFL may be disposed on the second electrode CE. The upper insulating layer TFL may include a plurality of thin layers. For example, the upper insulating layer TFL may include a capping layer and a thin film encapsulation layer. The thin film encapsulation layer may include a first inorganic layer, an organic layer, and a second inorganic layer.

Figure 23:
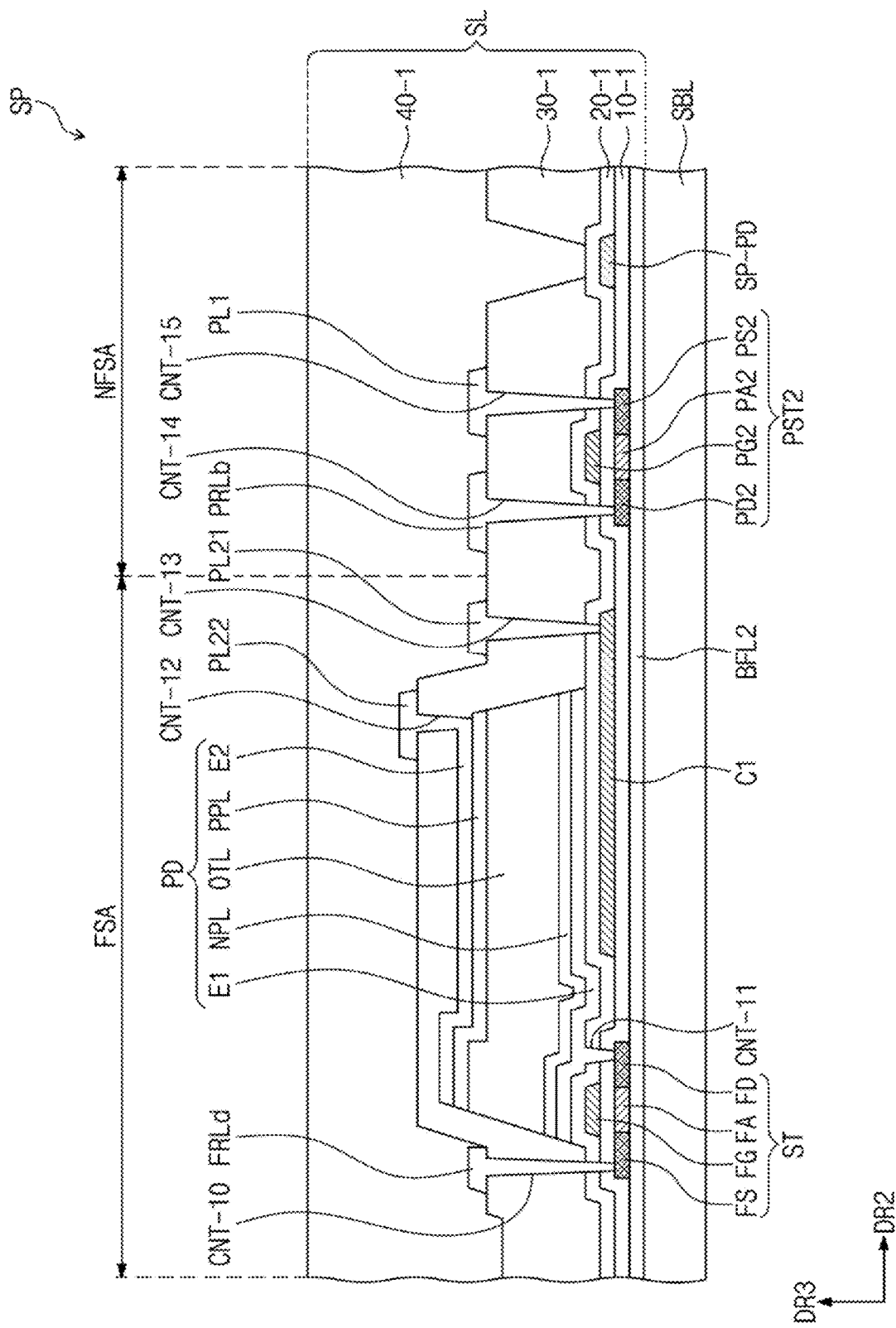
FIG. 23 is an enlarged cross-sectional view showing a sensing panel according to an exemplary embodiment of the present disclosure.

FIG. 23 is an enlarged cross-sectional view showing a sensing panel SP according to an exemplary embodiment of the present disclosure.

Referring to FIG. 23, the sensing panel SP may include a sensing base layer SBL and a sensing layer SL. The sensing panel SP may include a plurality of insulating layers, a semiconductor pattern, a conductive pattern, and a signal line. The insulating layer, a semiconductor layer, and a conductive layer may be formed by a coating or depositing process. Then, the insulating layer, the semiconductor layer, and the conductive layer may be selectively patterned by a photolithography process. The semiconductor pattern, the conductive pattern, and the signal line, which are included in the sensing layer SL, may be formed by the above-mentioned process.

The sensing base layer SBL may include a synthetic resin film. The synthetic resin film may include a heat curable resin. The sensing base layer SBL may have a multi-layer structure. For instance, the sensing base layer SBL may have a three-layer structure of a synthetic resin layer, an adhesive layer, and a synthetic resin layer. In particular, the synthetic resin layer may be a polyimide-based resin layer, however, it should not be particularly limited. The synthetic resin layer may include at least one of an acrylic-based resin, a methacrylic-based resin, polyisoprene, a vinyl-based resin, an epoxy-based resin, a urethane-based resin, a cellulose-based resin, a siloxane-based resin, a polyamide-based resin, and a perylene-based resin. In addition, the sensing base layer SBL may include a glass substrate, a metal substrate, or an organic/inorganic composite substrate.

At least one inorganic layer may be formed on an upper surface of the sensing base layer SBL. The inorganic layer may include at least one of aluminum oxide, titanium oxide, silicon oxide, silicon oxynitride, zirconium oxide, and a hafnium oxide. The inorganic layer may have a multi-layer structure of layers. The inorganic layers may form a barrier layer and/or a buffer layer. In the present exemplary embodiment, the display unit DU is shown as including the buffer layer BFL.

The buffer layer BFL2 may increase an adhesive force between the sensing base layer SBL and the semiconductor pattern. The buffer layer BFL2 may include a silicon oxide layer and a silicon nitride layer. The silicon oxide layer and the silicon nitride layer may be alternately stacked one on another.

The semiconductor pattern may be disposed on the buffer layer BFL2. The semiconductor pattern may include polysilicon, however, it should not be limited thereto or thereby. The semiconductor pattern may include amorphous silicon or metal oxide.

FIG. 23 shows a portion of the semiconductor pattern, and the semiconductor pattern may be further disposed in another area of the pixel PX in a plan view. The semiconductor pattern may be arranged with a specific pattern over pixels PX. The semiconductor pattern may have an electrical property varying depending on a presence or absence of a dopant. The semiconductor pattern may include a doped area and an un-doped area. The doped area may be doped with an N-type dopant or a P-type dopant. A P-type transistor may include a doped area doped with the P-type dopant.

The doped area may have a conductivity greater than that of the un-doped area and may substantially serve as an electrode or a signal line. The un-doped area may substantially correspond to an active region (or channel) of a transistor. For example, a portion of the semiconductor pattern may serve as the active region of the transistor, another portion of the semiconductor pattern may serve as a source or a drain of the transistor, and the other portion of the semiconductor pattern may serve as a connection electrode or a connection signal line.

As shown in FIGS. 13C and 23, the sensing area SA (refer to FIG. 7) of the sensing panel SP may include the fingerprint sensing area FSA and the non-fingerprint-sensing area NFSA defined adjacent to the fingerprint sensing area FSA. The non-fingerprint-sensing area NFSA may surround the fingerprint sensing area FSA. In the present exemplary embodiment, elements of the fingerprint sensing pixel FSXcd shown in FIG. 12 may be arranged in the fingerprint sensing area FSA. Elements of the pen sensing pixel PSXab shown in FIG. 10 may be arranged in the non-fingerprint-sensing area NFSA.

As shown in FIGS. 10, 12, and 23, a source FS, an active region FA, and a drain FD of the switching transistor ST in the fingerprint sensing pixel FSXcd may be formed from the semiconductor pattern, and a source PS2, an active region PA2, and a drain PD2 of the second switching transistor PST2 in the pen sensing pixel PSXab may be formed from the semiconductor pattern. The source FS and the drain FD may extend from the active region FA in opposite directions to each other in a cross-section, and the source PS2 and the drain PD2 may extend from the active region PA2 in opposite directions to each other in a cross-section.

A first insulating layer 10-1 may be disposed on the buffer layer BFL2. The first insulating layer 10-1 may commonly overlap the fingerprint sensing pixels FSX (refer to FIG. 7) and the pen sensing pixels PSX (refer to FIG. 7) and may cover the semiconductor pattern. The first insulating layer 10-1 may include an inorganic layer and/or an organic layer and may have a single-layer or multi-layer structure. The first insulating layer 10 may include at least one of aluminum oxide, titanium oxide, silicon oxide, silicon oxynitride, zirconium oxide, and a hafnium oxide. In the present exemplary embodiment, the first insulating layer 10-1 may have a single silicon oxide layer. An insulating layer of the sensing layer SL described later may include an inorganic layer and/or an organic layer and may have a single-layer or multi-layer structure as the first insulating layer 10-1. The inorganic layer may include at least one of the above-mentioned materials.

Gates FG and PG2 may be disposed on the first insulating layer 10-1. The gates FG and PG2 may be portions of the metal pattern. The gates FG and PG2 may overlap the active regions FA and PA2, respectively. The gates FG and PG2 may serve as a mask in a process of doping the semiconductor pattern. A capacitor electrode C1 may be disposed on the first insulating layer 10-1 to be spaced apart from the gates FG and PG2. The capacitor electrode C1 may overlap a first electrode E1 of a photodiode PD. The capacitor electrode C1 may be a portion of the metal pattern.

A portion of the first electrode E1 of the photodiode PD and the capacitor electrode C1 overlapping the portion of the first electrode E1 may form the capacitor CST (refer to FIG. 11).

A second insulating layer 20-1 may be disposed on the first insulating layer 10-1 to cover the gates FG and PG2 and the capacitor electrode C1. The second insulating layer 20-1 may commonly overlap the fingerprint sensing pixels FSX (refer to FIG. 7) and the pen sensing pixels PSX (refer to FIG. 7). The second insulating layer 20-1 may include an inorganic layer and/or an organic layer and may have a single-layer or multi-layer structure. In the present exemplary embodiment, the second insulating layer 20-1 may include a single silicon oxide layer.

The first electrode E1 may be disposed on the second insulating layer 20-1. The first electrode E1 may be connected to the drain FD of the switching transistor ST through a contact hole CNT-11 defined through the first insulating layer 10-1 and the second insulating layer 20-1.

An N-type layer NPL whose main carrier is an electron may be disposed on the first electrode E1. A photoelectric conversion layer OTL may be disposed on the N-type layer NPL. The photoelectric conversion layer OTL may generate electric charges in response to an external light. For example, the photoelectric conversion layer OTL may selectively absorb only a light having a specific wavelength band to cause the photoelectric conversion. A P-type layer PPL whose main carrier is a hole may be disposed on the photoelectric conversion layer OTL. A second electrode E2 may be disposed on the P-type layer PPL.

The first electrode E1 and the second electrode E2 may be formed of a transparent conductive oxide. For example, the first electrode E1 and the second electrode E2 may include at least one material selected from the group consisting of indium tin oxide (ITO), indium zinc oxide (IZO), zinc oxide (ZnO), $SnO_2$, antimony-doped tin oxide (ATO), Al-doped zinc oxide (AZO), gallium-doped zinc oxide (GZO), $TiO_2$, or fluorine-doped tin oxide (FTO).

A third insulating layer 30-1 may be disposed on the second insulating layer 20-1 to cover the second electrode E2. The fingerprint receiving line FRLd (refer to FIG. 12), the second voltage line PL22 (refer to FIG. 12), the first voltage line PL21 (refer to FIG. 12), the pen receiving line PRLb (refer to FIG. 10), and the first power supply line PL1 (refer to FIG. 10) may be disposed on the third insulating layer 30-1.

The fingerprint receiving line FRLd may be connected to the source FS of the switching transistor ST through a contact hole CNT-10 defined through the first insulating layer 10-1, the second insulating layer 20-1, and the third insulating layer 30-1.

The second voltage line PL22 may be connected to the second electrode E2 through a contact hole CNT-12 defined through the third insulating layer 30-1.

The first voltage line PL21 may be connected to the capacitor electrode C1 through a contact hole CNT-13 defined through the third insulating layer 30-1.

The pen receiving line PRLb may be connected to the drain PD2 of the second switching transistor PST2 through a contact hole CNT-14 defined through the first insulating layer 10-1, the second insulating layer 20-1, and the third insulating layer 30-1. Although not shown in figures, the pen receiving line PRLb may be connected to the one end of the sensing coil LL (refer to FIG. 10).

The first power line PL1 may be connected to the source PS2 of the second switching transistor PST2 through a contact hole CNT-15 defined through the first insulating layer 10-1, the second insulating layer 20-1, and the third insulating layer 30-1.

A fourth insulating layer 40-1 may be disposed on the third insulating layer 30-1 to cover the fingerprint receiving line FRLd, the second voltage line PL22, the first voltage line PL21, the pen receiving line PRLb, and the first power line PL1. In the exemplary embodiment shown in FIG. 23, the switching transistor ST, the photodiode PD, the fingerprint receiving line FRLd, the first voltage line PL21, and the second voltage line PL22 of the fingerprint sensing pixel FSXcd may be insulated from the second switching transistor PST2, the pen receiving line PRLb, and the first power line PL1 of the pen sensing pixel PSXab.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A sensing panel comprising:
   a sensing base layer;

a first group of fingerprint sensing pixels disposed on a first region of the sensing base layer and connected to a plurality of fingerprint scan lines and a plurality of first fingerprint receiving lines; and a plurality of pen sensing pixels including a first pen sensing pixel disposed on a second region of the sensing base layer and connected to a pen scan line, a first pen transmission line, and a first pen receiving line; and a first sensing coil disposed on the second region of the sensing base layer and surrounding the first region of the sensing base layer on which the first group of fingerprint sensing pixels are disposed, wherein the first sensing coil is connected to the first pen sensing pixel, and wherein the first pen sensing pixel is adjacent to a first fingerprint sensing pixel among the first group of fingerprint sensing pixels.

2. The sensing panel of claim 1, wherein the first group of fingerprint sensing pixels comprises x (x is a positive integer) fingerprint sensing pixels arranged in a first direction and y (y is a positive integer) fingerprint sensing pixels arranged in a second direction different from the first direction.

3. The sensing panel of claim 2, further comprising:

a second group of fingerprint sensing pixels disposed on a third region of the sensing base layer and connected to the plurality of fingerprint scan lines and a plurality of second fingerprint receiving lines, wherein the plurality of pen sensing pixels further include a second pen sensing pixel disposed on a fourth region of the sensing base layer and connected to the pen scan line, a second pen transmission line and a second pen receiving line; and a second sensing coil disposed on the fourth region of the sensing base layer and surrounding the third region of the sensing base layer on which the second group of fingerprint sensing pixels are disposed, and wherein the second sensing coil is connected to the second pen sensing pixel, and wherein the second pen sensing pixel is adjacent to a second fingerprint sensing pixel among the second group of fingerprint sensing pixels.

4. The sensing panel of claim 1, wherein the first sensing coil is disposed in a spiral shape, and wherein the first region of the sensing base layer is disposed within the spiral shape of the first sensing coil.

5. The sensing panel of claim 2, wherein the first region of the sensing base layer on which the first group of fingerprint sensing pixels is configured to receive an external light.

6. The sensing panel of claim 1, wherein one end of the first sensing coil is electrically connected to a ground voltage terminal, and wherein the other end of the first sensing coil is electrically connected to the first pen sensing pixel.

7. The sensing panel of claim 1, further comprising:

a sensing scan driving circuit configured to apply sensing scan signals to the plurality of fingerprint scan lines and the pen scan line.

8. The sensing panel of claim 3, further comprising:

a fingerprint scan driving circuit; and a pen scan driving circuit, wherein the plurality of fingerprint scan lines are connected to the first group of fingerprint sensing pixels and the second group of fingerprint sensing pixels, the pen scan line is connected to the first pen sensing pixel and the second pen sensing pixel, the fingerprint scan driving circuit is configured to apply a plurality of fingerprint scan signals to the plurality of fingerprint scan lines, and the pen scan driving circuit is configured to apply a pen scan signal to the pen scan line.

9. The sensing panel of claim 8, wherein the sensing base layer comprises:

a sensing area including the first region on which the first group of fingerprint sensing pixels are disposed and the second region on which the first pen sensing pixel is disposed, wherein the fingerprint scan driving circuit is disposed on a region of the sensing base layer adjacent to a first side of the sensing area, and wherein the pen scan driving circuit is disposed on a region of the sensing base layer adjacent to a second side, opposite the first side.

10. A display device comprising:

a display panel comprising an input sensor configured to sense an external input and a display including pixels;

a sensing panel disposed on one surface of the display panel to sense a fingerprint and a pen input; and a control circuit configured to control the sensing panel and receive a plurality of fingerprint receiving signals and a plurality of pen receiving signals from the sensing panel, the sensing panel comprising:

a sensing base layer;

a first group of fingerprint sensing pixels disposed on a first region of the sensing base layer and connected to a plurality of fingerprint scan lines and a plurality of first fingerprint receiving lines;

a plurality of pen sensing pixels including a first pen sensing pixel disposed on a second region of the sensing base layer and connected to a pen scan line, a first pen transmission line, and a first pen receiving line; and a first sensing coil disposed on the second region of the sensing base layer and surrounding the first region of the sensing base layer on which the first group of fingerprint sensing pixels are disposed, wherein the first sensing coil is connected to the first pen sensing pixel, and wherein the first pen sensing pixel is adjacent to a first fingerprint sensing pixel among the first group of fingerprint sensing pixels.

11. The display device of claim 10, wherein the first group of fingerprint sensing pixels comprises x (x is a positive integer) fingerprint sensing pixels arranged in a first direction and y (y is a positive integer) fingerprint sensing pixels arranged in a second direction different from the first direction.

12. The display device of claim 11, a second group of fingerprint sensing pixels disposed on a third region of the sensing base layer and connected to the plurality of fingerprint scan lines and a plurality of second fingerprint receiving lines, wherein the plurality of pen sensing pixels further include a second pen sensing pixel disposed on a fourth region of the sensing base layer and connected to the pen scan line, a second pen transmission line, and a second pen receiving line; and a second sensing coil disposed on the fourth region of the sensing base layer and surrounding the third region of the sensing base layer on which the second group of fingerprint sensing pixels are disposed, wherein the second sensing coil is connected to the second pen sensing pixel, and wherein the second pen sensing pixel is adjacent to a second fingerprint sensing pixel among the second group of fingerprint sensing pixels.

13. The display device of claim 10, wherein the first sensing coil is disposed in a spiral shape, and wherein the first region of the sensing base layer is disposed within the spiral shape of the first sensing coil.

14. The display device of claim 11, wherein the first region of the sensing base layer on which the first group of fingerprint sensing pixels is configured to receive an external light.

15. The display device of claim 10, wherein one end of the first sensing coil is electrically connected to a ground voltage terminal, and wherein the other end of the first sensing coil is electrically connected to the first pen sensing pixel.

16. The display device of claim 10, further comprising:

a sensing scan driving circuit configured to apply sensing scan signals to the plurality of fingerprint scan lines and the pen scan line.

17. The display device of claim 12, a fingerprint scan driving circuit; and a pen scan driving circuit, wherein the plurality of fingerprint scan lines are connected to the first group of fingerprint sensing pixels and the second group of fingerprint sensing pixels, the pen scan line is connected to the first pen sensing pixel and the second pen sensing pixel, the fingerprint scan driving circuit is configured to apply a plurality of fingerprint scan signals to the plurality of fingerprint scan lines, and the pen scan driving circuit is configured to apply a pen scan signal to the pen scan line.

18. The display device of claim 17, wherein the sensing base layer comprises:

a sensing area including the first region on which the first group of fingerprint sensing pixels are disposed and the second region on which the first pen sensing pixel is disposed, wherein the fingerprint scan driving circuit is disposed on a region of the sensing base layer adjacent to a first side of the sensing area, and wherein the pen scan driving circuit is disposed on a region of the sensing base layer adjacent to a second side, opposite the first side.

19. The display device of claim 17, wherein the control circuit comprises:

a fingerprint readout circuit configured to apply fingerprint scan control signals to the fingerprint scan driving circuit and to receive the plurality of fingerprint receiving signals from the plurality of first fingerprint receiving lines and the plurality of second fingerprint receiving lines; and a pen sensing circuit configured to apply pen scan control signals to the pen scan driving circuit, to apply pen transmission signals to the first pen transmission line and the second pen transmission line, and to receive the plurality of pen receiving signals from the first pen receiving line and the second pen receiving line.

20. The display device of claim 10, wherein the sensing panel further comprises:

a sensing layer in which the first group of fingerprint sensing pixels and the first pen sensing pixel are arranged.

21. The display device of claim 10, further comprising:

an optical layer disposed between the display panel and the sensing panel, wherein the optical layer includes a layer and transmission pin holes penetrating therethrough.

22. The display device of claim 10, wherein the display panel further comprises an optical layer disposed on one surface of the display, and wherein the optical layer includes a layer and transmission pin holes penetrating therethrough.

23. The display device of claim 22, wherein the sensing base layer comprises optical sensing areas, each of the optical sensing areas defined based on a viewing angle of a corresponding one of the transmission pin holes, the first region of the sensing base layer corresponds to a corresponding one of the optical sensing areas, and the first region of the sensing base layer has an area equal to or greater than a corresponding one of the optical sensing areas.

24. The display device of claim 10, wherein the display comprises a display area in which the pixels are arranged and a non-display area defined adjacent to the display area, the sensing base layer comprises a sensing area including the first region on which the first group of fingerprint sensing pixels is arranged and the second region on which the first pen sensing pixel is arranged, and the sensing area of the sensing panel overlap the display area of the display.

25. The display device of claim 24, further comprising:

a circuit board, wherein the sensing panel further comprises sensing pads arranged in a non-sensing area of the sensing base layer, adjacent to the sensing area, and wherein the circuit board is electrically connected to the sensing panel through the sensing pads, and the control circuit is disposed on the circuit board.

26. A sensing panel comprising:

a sensing base layer;

fingerprint sensing pixels disposed on a first region of the sensing base layer and connected to a plurality of fingerprint scan lines and a plurality of fingerprint receiving lines; and a pen sensing pixel disposed on a second region of the sensing base layer and connected to corresponding a pen scan line, a pen transmission line, and a pen receiving line, wherein the pen sensing pixel comprises a sensing coil surrounding the first region of the sensing base layer on which the fingerprint sensing pixels are disposed, wherein the sensing coil is disposed in a spiral shape, and wherein the first region of the sensing base layer is disposed within the spiral shape of the sensing coil.

27. A display device comprising:

a display panel comprising an input sensor configured to sense an external input and a display including pixels;

a sensing panel disposed on one surface of the display panel to sense a fingerprint and a pen input; and a control circuit configured to control the sensing panel and receive a plurality of fingerprint receiving signals and a plurality of pen receiving signals from the sensing panel, the sensing panel comprising:

a sensing base layer;

fingerprint sensing pixels disposed on a first region of the sensing base layer and connected to a plurality of fingerprint scan lines and a plurality of fingerprint receiving lines; and a pen sensing pixel disposed on a second region of the sensing base layer and connected to corresponding a pen scan line, a pen transmission line, and a pen receiving line, wherein the pen sensing pixel comprises a sensing coil surrounding the first region of the sensing base layer on which the fingerprint sensing pixels are disposed, wherein one end of the sensing coil is electrically connected to a ground voltage terminal, and wherein the other end of the sensing coil is electrically connected to the pen sensing pixel.

* * * * *